(12) United States Patent
Lim et al.

(10) Patent No.: US 8,710,592 B2
(45) Date of Patent: Apr. 29, 2014

(54) SRAM CELLS USING SHARED GATE ELECTRODE CONFIGURATION

(75) Inventors: Sunme Lim, Yongin-si (KR); Hanbyung Park, Yongin-si (KR); Ho-Kwon Cha, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 180 days.

(21) Appl. No.: 13/412,211

(22) Filed: Mar. 5, 2012

(65) Prior Publication Data

US 2012/0228714 A1    Sep. 13, 2012

(30) Foreign Application Priority Data

Mar. 7, 2011 (KR) .................... 10-2011-0020026

(51) Int. Cl.
*H01L 21/8244* (2006.01)
(52) U.S. Cl.
USPC ............... 257/369; 257/903; 257/E21.661; 257/E27.098; 365/154; 365/230.05
(58) Field of Classification Search
USPC .......................................... 257/903, E27.098
See application file for complete search history.

(56) References Cited

U.S. PATENT DOCUMENTS

| | | | |
|---|---|---|---|
| 5,754,468 A | 5/1998 | Hobson | |
| 6,804,143 B1 | 10/2004 | Hobson | |
| 6,914,338 B1* | 7/2005 | Liaw | 257/516 |
| 7,120,080 B2 | 10/2006 | Lee et al. | |
| 7,330,392 B2 | 2/2008 | Lee et al. | |
| 2004/0151041 A1 | 8/2004 | Lee et al. | |
| 2005/0253287 A1* | 11/2005 | Liaw | 257/903 |
| 2006/0131614 A1* | 6/2006 | Liaw | 257/222 |
| 2007/0025174 A1* | 2/2007 | Lee et al. | 365/230.05 |
| 2008/0031029 A1* | 2/2008 | Liaw | 365/63 |
| 2008/0273382 A1* | 11/2008 | Wang | 365/181 |
| 2009/0268499 A1* | 10/2009 | Kouchi et al. | 365/51 |
| 2011/0211384 A1* | 9/2011 | Perisetty | 365/154 |
| 2012/0195151 A1* | 8/2012 | Ostermayr et al. | 365/230.05 |

FOREIGN PATENT DOCUMENTS

KR    1020040069823 A    8/2004

* cited by examiner

*Primary Examiner* — William F Kraig
*Assistant Examiner* — Pavel Ivanov
(74) *Attorney, Agent, or Firm* — Myers Bigel Sibley & Sajovec, P.A.

(57) ABSTRACT

An SRAM cell includes a first PMOS pass transistor comprising a first gate electrode disposed on a first PMOS active region, a first NMOS pass transistor comprising a second gate electrode disposed on a first NMOS active region, a first PMOS pull-up transistor and a first NMOS pull-down transistor sharing a third gate electrode disposed on the first PMOS active region and the first NMOS active region and extending therebetween, a second PMOS pass transistor comprising a fourth gate electrode disposed on a second PMOS active region, a second NMOS pass transistor comprising a fifth gate electrode disposed on a second NMOS active region and a second pull-up transistor and a second pull-down transistor sharing a sixth gate electrode disposed on the second PMOS active region and the second NMOS active region and extending therebetween.

20 Claims, 17 Drawing Sheets

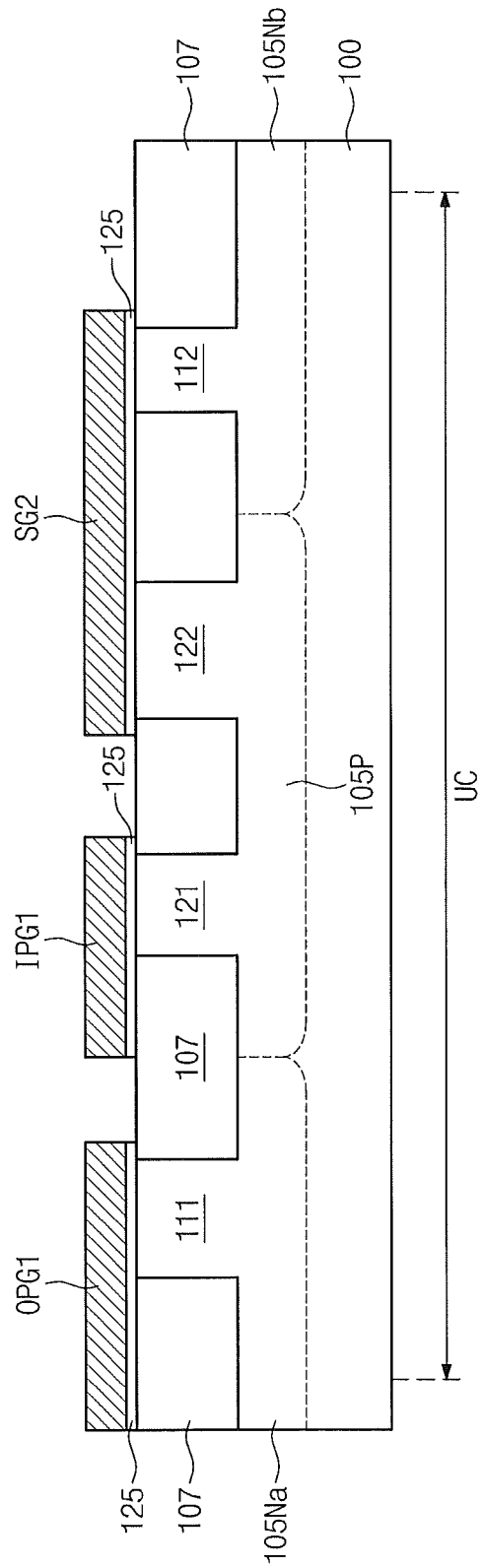

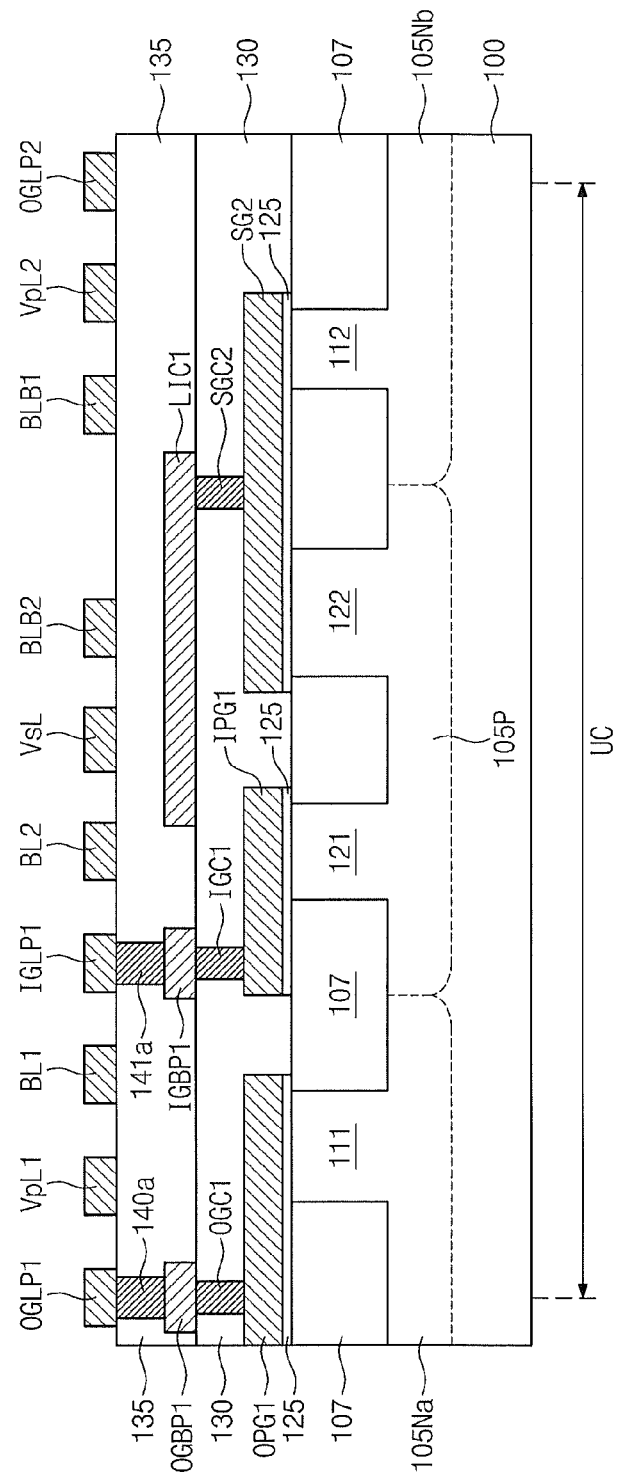

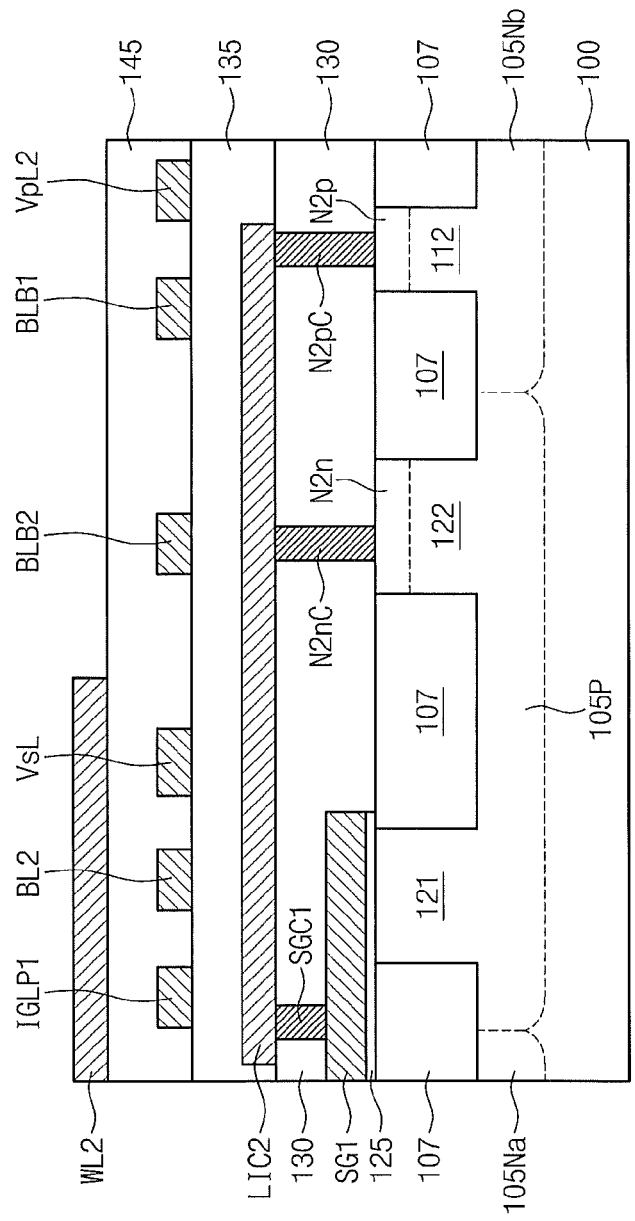

SRAM CELLS USING SHARED GATE ELECTRODE CONFIGURATION

CROSS-REFERENCE TO RELATED APPLICATIONS

This U.S. non-provisional patent application claims priority under 35 U.S.C. §119 to Korean Patent Application No. 10-2011-0020026, filed on Mar. 7, 2011, the entirety of which is incorporated by reference herein.

BACKGROUND

The present disclosure herein relates to semiconductor devices and, more particularly, to semiconductor devices including static random access memory (SRAM) cells.

Semiconductor devices are widely used in various industrial areas such as electronic systems, automobiles and/or vessels because of small size, multi-function and/or low fabrication cost thereof. Semiconductor devices include semiconductor memory devices storing logic data, semiconductor logic devices processing operations of logical data, and hybrid semiconductor devices having both memory and logic functions. Semiconductor logic devices may include logic circuits performing logical operations and semiconductor memory cells storing data used in the logical operations.

Semiconductor memory cells may be categorized as either nonvolatile memory cells or volatile memory cells. Nonvolatile memory cells typically retain stored data even when their power supplies are interrupted. Nonvolatile memory cells may include flash memory cells, phase change memory cells and magnetic memory cells.

In contrast, volatile memory cells typically lose their stored data when their power supplies are interrupted. Volatile memory cells may include dynamic random access memory (DRAM) cells and SRAM cells. SRAM cells typically are capable of greater operational speeds than DRAM cells. Further, while DRAM cells typically require periodical data refreshing by rewriting data to the memory, SRAM cells typically do not require refreshing. Because of these characteristics of SRAM cells, some electronic systems such as portable devices still employ SRAM cells.

However, a typical SRAM cell may occupy a significantly greater area than a typical DRAM cell. Thus, compact SRAM cells have been developed to increase the level of integration density of semiconductor devices including such SRAM cells. There is also an ongoing demand for high performance SRAM cells.

SUMMARY

Some embodiments of the inventive subject matter are directed to SRAM cells.

In some embodiments, an SRAM cell comprises first and second PMOS active regions defined in a semiconductor substrate and first and second NMOS active regions defined in the semiconductor substrate. The first and second NMOS active regions are disposed between the first PMOS active region and the second PMOS active region. A first PMOS pass gate crosses over the first PMOS active region, and a first NMOS pass gate crosses over the first NMOS active region. A first shared gate crosses over the first PMOS active region and the first NMOS active region, and a second PMOS pass gate crosses over the second PMOS active region. A second NMOS pass gate crosses over the second NMOS active region, and a second shared gate crosses over the second PMOS active region and the second NMOS active region.

In some embodiments, a channel width of a channel region defined in the first PMOS active region under the first PMOS pass gate may be different from a channel width of a channel region defined in the first PMOS active region under the first shared gate. A channel width of the channel region defined in the first PMOS active region under the first PMOS pass gate may be greater than a channel width of the channel region defined in the first PMOS active region under the first shared gate.

In some embodiments, a channel width of a channel region defined in the first NMOS active region under the first NMOS pass gate may be different from a channel width of a channel region defined in the first NMOS active region under the first shared gate.

In some embodiments, a channel width of a channel region defined in the first PMOS active region under the first PMOS pass gate may be greater than a channel width of a channel region defined in the first NMOS active region under the first NMOS pass gate.

In some embodiments, the second PMOS active region, the second NMOS active region, the second PMOS pass gate, the second NMOS pass gate and the second shared gate may be respectively symmetric to the first PMOS active region, the first NMOS active region, the first PMOS pass gate, the first NMOS pass gate and the first shared gate with respect to a central point of a unit cell region, when viewed from a plan view.

In some embodiments, the first PMOS pass gate, the first NMOS pass gate and the second shared gate may be arrayed in a first direction to constitute a first row, and the first shared gate, the second NMOS pass gate and the second PMOS pass gate may be arrayed in the first direction to constitute a second row. The first and second rows may be separated from each other in a second direction perpendicular to the first direction.

In some embodiments, the SRAM cell may further include a first word line electrically connected to the first and second PMOS pass gates and a second word line electrically connected to the first and second NMOS pass gates. The first and second word lines may be located at a same level from a top surface of the semiconductor substrate, and the first and second word lines may extend in one direction. The SRAM cell may further include a first P-type node doped region disposed in the first PMOS active region between the first PMOS pass gate and the first shared gate, a first N-type node doped region disposed in the first NMOS active region between the first NMOS pass gate and the first shared gate, a first local interconnection electrically connecting the first P-type node doped region and the first N-type node doped region to the second shared gate, a second P-type node doped region disposed in the second PMOS active region between the second PMOS pass gate and the second shared gate, a second N-type node doped region disposed in the second NMOS active region between the second NMOS pass gate and the second shared gate, and a second local interconnection electrically connecting the second P-type node doped region and the second N-type node doped region to the first shared gate. The first and second local interconnections may be located at a lower level than the first and second word lines from a top surface of the semiconductor substrate.

In some embodiments, the SRAM cell may further include a first bit doped region disposed in the first PMOS active region located at one side of the first PMOS pass gate, a first power doped region disposed in the first PMOS active region located at one side of the first shared gate, a first bit bar doped region disposed in the second PMOS active region located at one side of the second PMOS pass gate, and a second power doped region disposed in the second PMOS active region located at one side of the second shared gate. The first PMOS pass gate and the first shared gate may be disposed between the first bit doped region and the first power doped region. The second PMOS pass gate and the second shared gate may be disposed between the first bit bar doped region and the second power doped region. The SRAM cell may further include a first bit line electrically connected to the first bit doped region, a first bit bar line electrically connected to the first bit bar doped region, a first power line electrically connected to the first power doped region, and a second power line electrically connected to the second power doped region. The first and second word lines may intersect the first bit line, the first bit bar line, the first power line and the second power line. The SRAM cell may further include a second bit doped region disposed in the first NMOS active region located at one side of the first NMOS pass gate, a first ground doped region disposed in the first NMOS active region located at one side of the first shared gate, a second bit bar doped region disposed in the second NMOS active region located at one side of the second NMOS pass gate, and a second ground doped region disposed in the second NMOS active region located at one side of the second shared gate. The first NMOS pass gate and the first shared gate may be disposed between the second bit doped region and the first ground doped region, and the second NMOS pass gate and the second shared gate may be disposed between the second bit bar doped region and the second ground doped region. The SRAM cell may further include a second bit line electrically connected to the second bit doped region, a second bit bar line electrically connected to the second bit bar doped region, and a ground line electrically connected to the first ground doped region and the second ground doped region. The first and second word lines may intersect the second bit line, the second bit bar line and the ground line. The first bit bar doped region, the second power doped region, the second bit bar doped region and the second ground doped region may be respectively symmetric to the first bit doped region, the first power doped region, the second bit doped region and the first ground doped region with respect to a central point of a unit cell region, when viewed from a plan view.

In further embodiments, an SRAM cell includes elongate first and second PMOS active regions and elongate first and second NMOS active regions arranged in a row in a semiconductor substrate, the first and second NMOS active regions disposed between the first and second PMOS active regions and each of the first and second PMOS active regions. The SRAM cell further includes a first PMOS pass transistor comprising a first gate electrode disposed on the first PMOS active region, a first NMOS pass transistor comprising a second gate electrode disposed on the first NMOS active region, a first PMOS pull-up transistor and a first NMOS pull-down transistor sharing a third gate electrode disposed on the first PMOS active region and the first NMOS active region and extending therebetween, a second PMOS pass transistor comprising a fourth gate electrode disposed on the second PMOS active region, a second NMOS pass transistor comprising a fifth gate electrode disposed on the second NMOS active region and a second pull-up transistor and a second pull-down transistor sharing a sixth gate electrode disposed on the second PMOS active region and the second NMOS active region and extending therebetween.

In some embodiments, the first PMOS pass transistor may be coupled to a first bit and the second PMOS transistor may be coupled to a first inverted bit line such that the first and second PMOS pass transistors provide a first port of the SRAM cell. The first NMOS pass transistor may be coupled to a second bit line and the second NMOS transistor may be coupled to a second inverted bit line such that the first and second NMOS pass transistors provide a second port of the SRAM cell. The first and second PMOS pass transistors may be coupled to a first word line and the first and second NMOS transistors may be coupled to a second word line.

In some embodiments, the first and second PMOS active regions and the first and second NMOS active regions may each have wide and narrow portions. The first gate electrode may be disposed on the wide portion of the first PMOS active region. The second gate electrode may be disposed on the narrow portion of the first NMOS active region. The third gate electrode may be disposed on the narrow portion of the first PMOS active region and the wide portion of the first NMOS active region. The fourth gate electrode may be disposed on the wide portion of the second PMOS active region. The fifth gate electrode may be disposed on the narrow portion of the second NMOS active region. The sixth gate electrode may be disposed on the narrow portion of the second PMOS active region and the wide portion of the second NMOS active region. The first and second PMOS pass transistors and the first and second NMOS pull-down transistors may have a greater channel width than the first and second NMOS pass transistors and the first and second PMOS transistors.

According to some embodiments, the first and second PMOS active regions and the first and second NMOS active regions may be point symmetric with respect to a point located between the first and second NMOS active regions. The first, second, third, fourth, fifth and sixth gate electrodes may be point symmetric with respect to the point located between the first and second NMOS active regions. In some embodiments, the first, second and sixth gate electrodes may be aligned along a first line and wherein the third, fourth and fifth gate electrodes may be aligned a long a second line parallel to the first line.

The SRAM cell may further include a wiring structure configured to connect the first PMOS active region to a power supply node and to a first bit line, to connect the second PMOS active region to the power supply node and to a first inverted bit line, to connect the first NMOS active region to a ground node and to a second bit line, to connect the second NMOS active region to the ground node and to a second inverted bit line, to connect the third gate electrode to the second PMOS active region and the second NMOS active region and to connect the sixth gate electrode to first PMOS active region and the first NMOS active region. The wiring structure may include a first line electrically contacting the third gate electrode, a point on the second NMOS active region between the fifth electrode and the sixth electrode and a point on the second PMOS active region between the fourth electrode and the sixth electrode and a second line electrically contacting the sixth gate electrode, a point on the first NMOS active region between the second electrode and the third electrode and a point on the first PMOS active region between the first electrode and the third electrode.

BRIEF DESCRIPTION OF THE DRAWINGS

The inventive subject matter will become more apparent in view of the attached drawings and accompanying detailed description.

FIG. 2B is a cross sectional view taken along a line I-I' of FIG. 2A.

FIG. 4B is a cross sectional view taken along a line I-I' of FIG. 4A.

FIG. 5E is a cross sectional view taken along a line IV-IV' of FIG. 5A.

DETAILED DESCRIPTION

Figure 1:
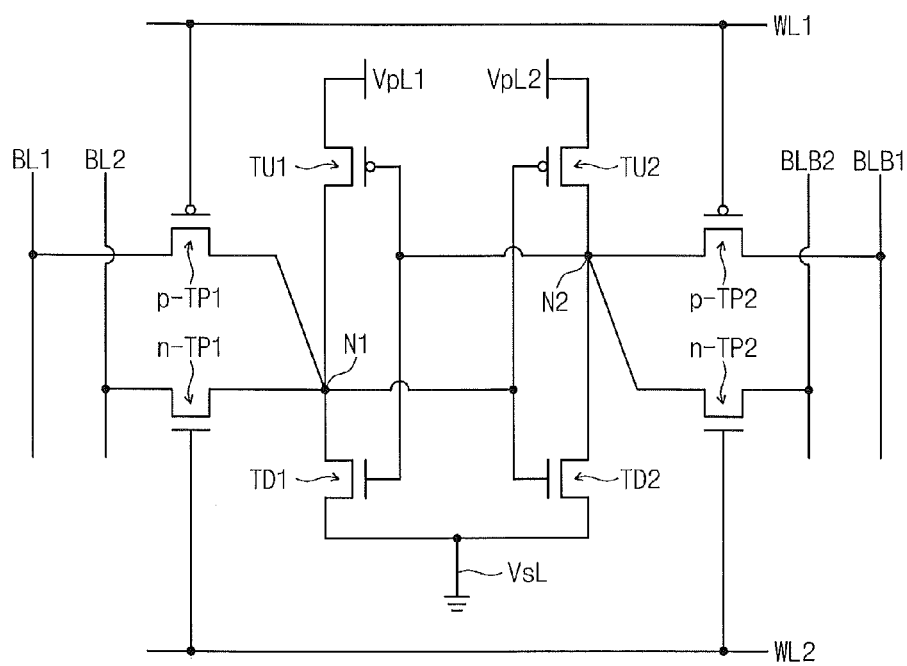
FIG. 1 is an equivalent circuit diagram of an SRAM cell according to some embodiments of the inventive subject matter.

The inventive subject matter will now be described more fully hereinafter with reference to the accompanying drawings, in which exemplary embodiments of the inventive subject matter are shown. The advantages and features of the inventive subject matter and methods of achieving them will be apparent from the following exemplary embodiments that will be described in more detail with reference to the accompanying drawings. It should be noted, however, that the inventive subject matter is not limited to the following exemplary embodiments, and may be implemented in various forms. Accordingly, the exemplary embodiments are provided only to disclose the inventive subject matter and let those skilled in the art know the category of the inventive subject matter. In the drawings, embodiments of the inventive subject matter are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments in the detailed description may be described with sectional views as idealized exemplary views of the inventive subject matter. Accordingly, shapes of the exemplary views may be modified according to manufacturing techniques and/or allowable errors. Therefore, embodiments of the inventive subject matter are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive subject matter.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive subject matter explained and illustrated herein include their complementary counterparts. The same reference numerals or the same reference designators denote the same elements throughout the specification.

FIG. 1 is an equivalent circuit diagram of an SRAM cell according to some embodiments of the inventive subject matter. The SRAM cell may include a first PMOS pass transistor p-TP1, a second PMOS pass transistor p-TP2, a first NMOS pass transistor n-TP1, a second NMOS pass transistor n-TP2, a first pull-up transistor TU1, a second pull-up transistor TU2, a first pull-down transistor TD1 and a second pull-down transistor TD2. The first and second pull-up transistors may be PMOS transistors, like the first and second PMOS pass transistors p-TP1 and p-TP2. The first and second pull-down transistors may be NMOS transistors, like the first and second NMOS pass transistors n-TP1 and n-TP2.

The first pull-up transistor TU1 and the first pull-down transistor TD1 may constitute a first inverter, and the second pull-up transistor TU2 and the second pull-down transistor TD2 may constitute a second inverter. In more detail, a drain of the first pull-up transistor TU1 and a drain of the first pull-down transistor TD1 may be electrically connected to each other at a first node N1, and a gate of the first pull-up transistor TU1 may be electrically connected to a gate of the first pull-down transistor TD1. A source of the first pull-up transistor TU1 may be electrically connected to a first power line VpL1, and a source of the first pull-down transistor TD1 may be electrically connected to a ground line VsL. As such, the first pull-up transistor TU1 and the first pull-down transistor TD1 may constitute the first inverter. Similarly, a drain of the second pull-up transistor TU2 and a drain of the second pull-down transistor TD2 may be electrically connected to each other at a second node N2, and a gate of the second pull-up transistor TU2 may be electrically connected to a gate of the second pull-down transistor TD2. A source of the second pull-up transistor TU2 may be electrically connected to a second power line VpL2, and a source of the second pull-down transistor TD2 may be electrically connected to the ground line VsL. As such, the second pull-up transistor TU2 and the second pull-down transistor TD2 may constitute the second inverter.

The gates of the first pull-up transistor TU1 and the first pull-down transistor TD1 connected to each other may correspond to an input terminal of the first inverter, and the first node N1 may correspond to an output terminal of the first inverter. Similarly, the gates of the second pull-up transistor TU2 and the second pull-down transistor TD2 connected to each other may correspond to an input terminal of the second inverter, and the second node N2 may correspond to an output terminal of the second inverter. The first and second inverters may be coupled to each other to constitute a latch circuit. In particular, the gates of the first pull-up transistor TU1 and the first pull-down transistor TD1 may be electrically connected to the second node N2, and the gates of the second pull-up transistor TU2 and the second pull-down transistor TD2 may be electrically connected to the first node N1.

A source of the first PMOS pass transistor p-TP1 may be electrically connected to the first node N1. A source of the first NMOS pass transistor n-TP1 may also be electrically connected to the first node N1. A drain of the first PMOS pass transistor p-TP1 may be electrically connected to a first bit line BL1, and a drain of the first NMOS pass transistor n-TP1 may be electrically connected to a second bit line BL2. The first PMOS pass transistor p-TP1 and the first NMOS pass transistor n-TP1 may be electrically connected in parallel to the first node N1. Similarly, a source of the second PMOS pass transistor p-TP2 may be electrically connected to the second node N2, and a source of the second NMOS pass transistor n-TP2 may also be electrically connected to the second node N2. A drain of the second PMOS pass transistor p-TP2 may be electrically connected to a first bit bar (inverted bit) line BLB1, and a drain of the second NMOS pass transistor n-TP2 may be electrically connected to a second bit bar line BLB2. The second PMOS pass transistor p-TP2 and the second NMOS pass transistor n-TP2 may be electrically connected in parallel to the second node N2.

Gates of the first and second PMOS pass transistors p-TP1 and p-TP2 may be electrically connected to a first word line WL1, and gates of the first and second NMOS pass transistors n-TP1 and n-TP2 may be electrically connected to a second word line WL2. As such, an SRAM cell according to some embodiments of the inventive subject matter may be realized.

As illustrated in FIG. 1, the SRAM cell may include the first PMOS pass transistor p-TP1 and the first NMOS pass transistor n-TP1 connected to the first node N1, and the second PMOS pass transistor p-TP2 and the second NMOS pass transistor n-TP2 connected to the second node N21. Thus, the SRAM cell may have a dual port configuration. The first word line WL1, the first bit line BL1 and the first bit bar line BLB1 may correspond to one of the dual ports, and the second word line WL2, the second bit line BL2 and the second bit bar line BLB2 may correspond to the other of the dual ports.

In more detail, using the first word line WL1, the first bit line BL1 and the first bit bar line BLB1, logical data may be stored at the first and second nodes N1 and N2 or the logical data stored at the first and second nodes N1 and N2 may be read out. Using the second word line WL2, the second bit line BL2 and the second bit bar line BLB2, logical data may be stored at the first and second nodes N1 and N2 or the logical data stored at the first and second nodes N1 and N2 may be read out. As a result, the SRAM cell may have dual ports, thereby enhancing flexibility and/or a degree of freedom to a writing operation (e.g., a program operation) and a read operation. Thus, high performance SRAM cells may be realized.

In some embodiments, in the event that the first word line WL1 is selected, a ground voltage may be applied to the first word line WL1 to turn on the first and second PMOS pass transistors p-TP1 and p-TP2. However, the voltage applied to the first word line WL1 is not limited to the ground voltage when the first word line WL1 is selected. For example, a negative voltage may also be applied to the first word line WL1 when the first word line WL1 is selected. In the event that the second word line WL2 is selected, a power supply voltage may be applied to the second word line WL2 to turn on the first and second NMOS pass transistors n-TP1 and n-TP2.

Figure 2A:
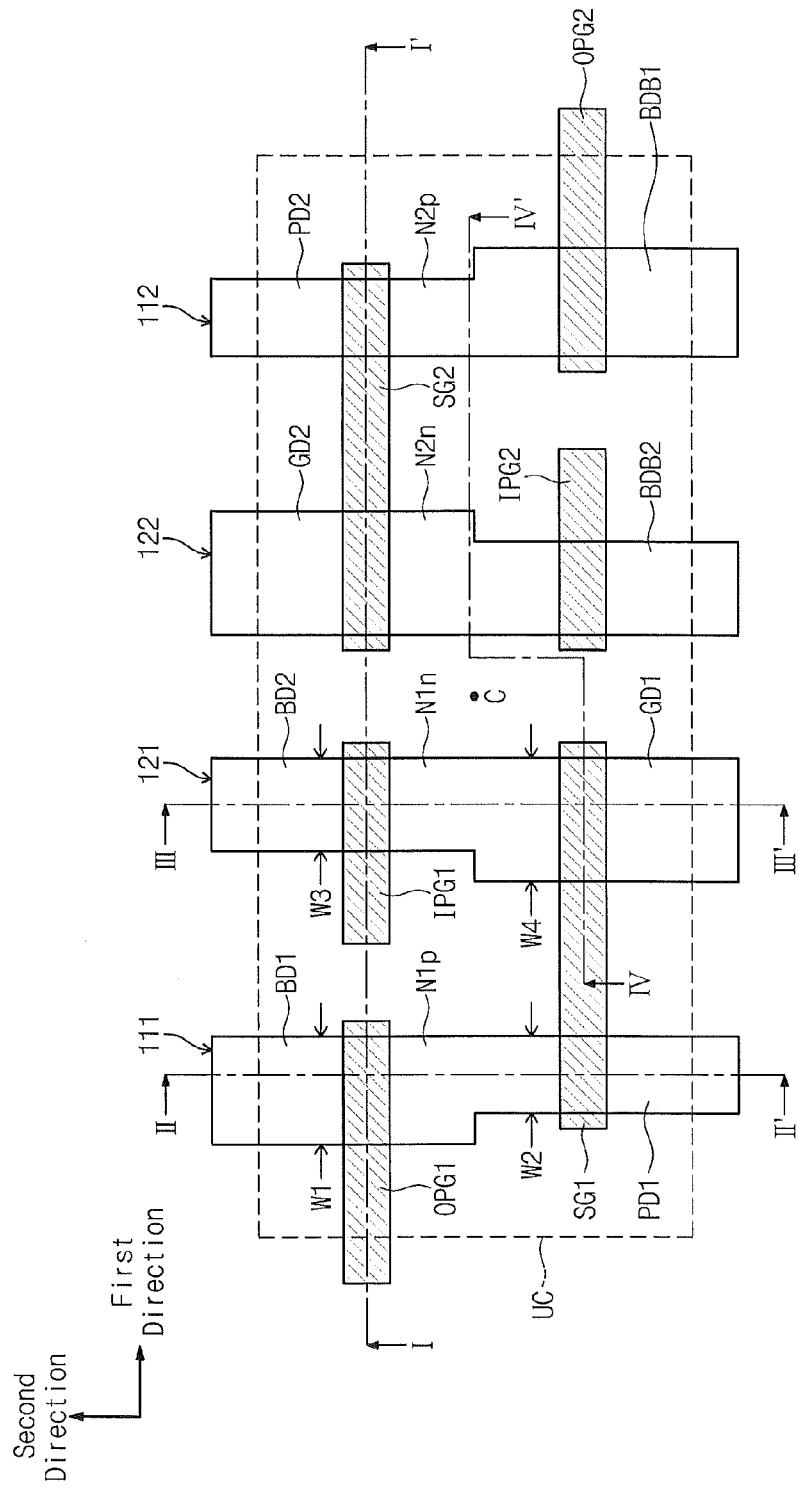
FIG. 2A is a plan view illustrating active regions and gate electrodes of an SRAM cell according to some embodiments of the inventive subject matter.
Figure 2C:
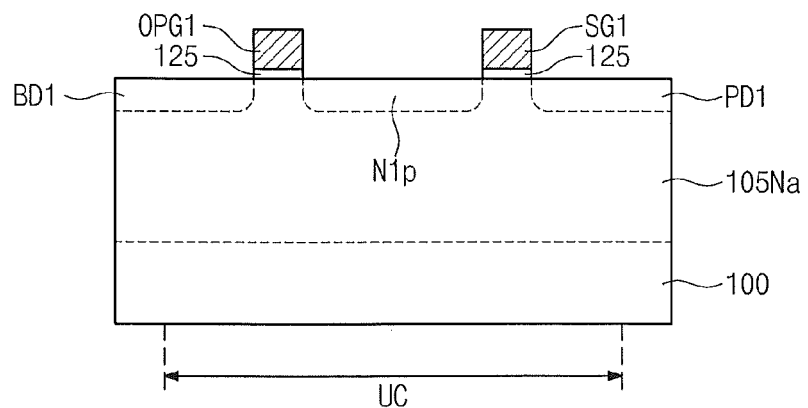
FIG. 2C is a cross sectional view taken along a line II-II' of FIG. 2A.
Figure 2D:
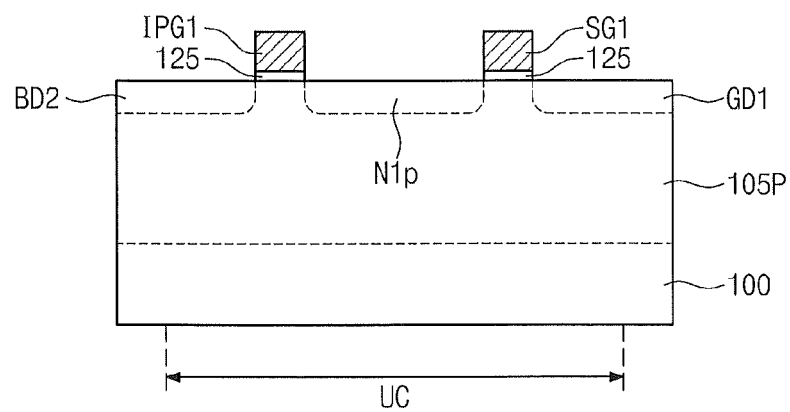
FIG. 2D is a cross sectional view taken along a line III-III' of FIG. 2A.
Figure 2E:
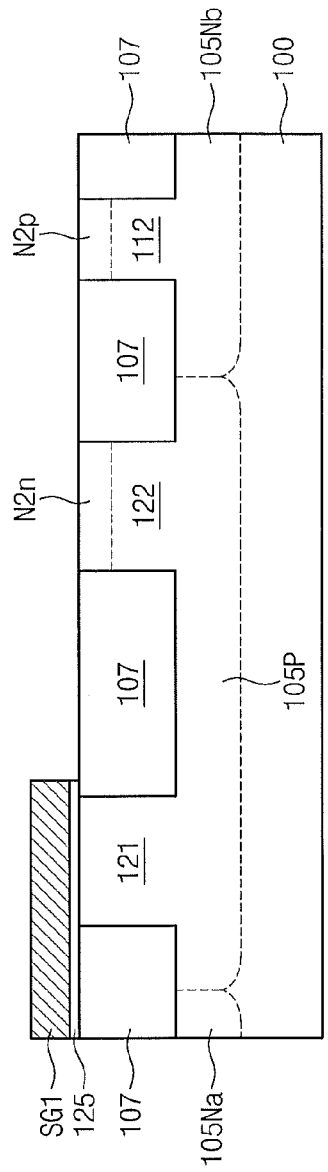
FIG. 2E is a cross sectional view taken along a line IV-IV' of FIG. 2A.

FIG. 2A is a plan view illustrating active regions and gate electrodes of an SRAM cell according to some embodiments of the inventive subject matter, FIG. 2B is a cross sectional view taken along a line I-I' of FIG. 2A, and FIG. 2C is a cross sectional view taken along a line II-II' of FIG. 2A. In addition, FIG. 2D is a cross sectional view taken along a line III-III' of FIG. 2A, and FIG. 2E is a cross sectional view taken along a line IV-IV' of FIG. 2A. In the drawing of FIG. 2A, an inside region of a quadrangle shown in dotted line UC may indicate a single SRAM cell. An outside region of the quadrangle shown in dotted line UC may correspond to a region in which the neighbor SRAM cells are located. In some embodiments, the single SRAM cell in the quadrangle shown in dotted line UC may share elements overlapping the dotted line UC with the neighbor SRAM cells in the outside region of the quadrangle shown in dotted line UC.

Referring to FIGS. 2A to 2E, the SRAM cell UC according to some embodiments may include active regions 111, 112, 121 and 122 that are defined in the semiconductor substrate 100 and are horizontally separated from each other. As illustrated in FIG. 2A, a first NMOS active region 121 and a second NMOS active region 122 may be disposed between a first PMOS active region 111 and a second PMOS active region 112. The first NMOS active region 121 may be adjacent to the first PMOS active region 111, and the second NMOS active region 122 may be adjacent to the second PMOS active region 112. For example, the first PMOS active region 111, the first NMOS active region 121, the second NMOS active region 122 and the second PMOS active region 112 may be arrayed in a first direction in order. In some embodiments, the active regions 111, 112, 121 and 122 may extend in parallel in a second direction perpendicular to the first direction.

As illustrated in FIGS. 2A to 2E, the active regions 111, 112, 121 and 122 may be defined by an isolation pattern 107 formed in the semiconductor substrate 100. The active regions 111, 112, 121 and 122 may correspond to portions of the semiconductor substrate 100, which are surrounded by the isolation pattern 107, respectively.

PMOS transistors may be formed in and on the first and second PMOS active regions 111 and 112. Thus, the first and second PMOS active regions 111 and 112 may be doped with N-type dopants. NMOS transistors may be formed in and on the first and second NMOS active regions 121 and 122. Thus, the first and second NMOS active regions 121 and 122 may be doped with P-type dopants. For example, the SRAM cell UC may include a first N-type well 105Na, a second N-type well 105Nb and a P-type well 105P. The P-type well 105P may be disposed between the first N-type well 105Na and the second N-type well 105Nb. That is, PN junction areas may exist between the P-type well 105P and the N-type wells 105Na and 105Nb. The first PMOS active region 111 may be defined in the first N-type well 105Na, and the second PMOS active region 112 may be defined in the second N-type well 105Nb. The first and second NMOS active regions 121 and 122 may be defined in the P-type well 105P. In some embodiments, the isolation pattern 107 may be formed after formation of the wells 105Na, 105Nb and 105P.

Referring again to FIGS. 2A to 2E, a first PMOS pass gate OPG1 may cross over the first PMOS active region 111, and a first NMOS pass gate IPG1 may cross over the first NMOS active region 121. The first NMOS pass gate IPG1 may be spaced apart from the first PMOS pass gate OPG1. A first shared gate SG1 may cross over the first PMOS active region 111 and the first NMOS active region 121. The first shared gate SG1 may be spaced apart from the first PMOS pass gate OPG1 and the first NMOS pass gate IPG1. The first shared gate SG1 may be disposed at one side of the first PMOS pass gate OPG1 and the first NMOS pass gate IPG1.

A second PMOS pass gate OPG2 may cross over the second PMOS active region 112, and a second NMOS pass gate IPG2 may cross over the second NMOS active region 122. The second NMOS pass gate IPG2 may be spaced apart from the second PMOS pass gate OPG2. A second shared gate SG2 may cross over the second PMOS active region 112 and the second NMOS active region 122. The second shared gate SG2 may be disposed at one side of the second PMOS pass gate OPG2 and the second NMOS pass gate IPG2. The gates OPG1, IPG1, SG1, OPG2, IPG2 and SG2 may be laterally separated from each other.

A gate dielectric layer 125 may be disposed between the gates OPG1, IPG1, SG1, OPG2, IPG2 and SG2 and the active regions 111, 112, 121 and 122.

As illustrated in FIG. 2A, in the plane of the figure (corresponding to the major surface of the substrate 100), the first PMOS pass gate OPG1 and the second PMOS pass gate OPG2 are point symmetric with respect to a point C located between the first and second NMOS active regions 121, 122 of the SRAM cell UC. Further, the first NMOS pass gate IPG1 and the second NMOS pass gate IPG2 may also be disposed to be symmetrical to a central point C of the SRAM cell UC. Moreover, the first shared gate SG1 and the second shared gate SG2 are point symmetric with respect to a central point C of the SRAM cell UC. The second PMOS pass gate OPG2, the second NMOS pass gate IPG2 and the second shared gate SG2 may be disposed to have a point symmetric configuration to the first PMOS pass gate OPG1, the first NMOS pass gate IPG1 and the first shared gate SG1, respectively, when viewed from a plan view.

The central point C of the SRAM cell UC may correspond to a central point of a unit cell region that the SRAM cell UC is disposed. In some embodiments, the first PMOS pass gate OPG1, the first NMOS pass gate IPG1 and the second shared gate SG2 may be arrayed in the first direction to constitute a first row which is parallel with the first direction. The first shared gate SG1, the second NMOS pass gate IPG2 and the second PMOS pass gate OPG2 may be arrayed in the first direction to constitute a second row which is parallel with the first direction. The first and second rows may be separated from each other in the second direction.

A first p-type node doped region N1$p$ may be disposed in the first PMOS active region 111 between the first PMOS pass gate OPG1 and the first shared gate SG1. A first bit doped region BD1 may be disposed in the first PMOS active region 111 which is located at one side of the first PMOS pass gate OPG1 and opposite to the first p-type node doped region N1$p$. The first PMOS pass gate OPG1 may be disposed over the first PMOS active region 111 between the first p-type node doped region N1$p$ and the first bit doped region BD1. A first power doped region PD1 may be disposed in the first PMOS active region 111 that is located at one side of the first shared gate SG1 and opposite to the first p-type node doped region N1$p$. That is, a portion of the first shared gate SG1 may be disposed over the first PMOS active region 111 between the first p-type node doped region N1$p$ and the first power doped region PD1. The first PMOS pass gate OPG1, the first p-type node doped region N1$p$ and the portion of the first shared gate SG1 may be disposed between the first bit doped region BD1 and the first power doped region PD1. The first bit doped region BD1, the first p-type node doped region N1$p$ and the first power doped region PD1 may be doped with P-type dopants.

A first n-type node doped region N1$n$ may be disposed in the first NMOS active region 121 between the first NMOS pass gate IPG1 and the first shared gate SG1. A second bit doped region BD2 may be disposed in the first NMOS active region 121 which is located at one side of the first NMOS pass gate IPG1 and opposite to the first n-type node doped region N1$n$. The first NMOS pass gate IPG1 may be disposed over the first NMOS active region 121 between the first n-type node doped region N1$n$ and the second bit doped region BD2. A first ground doped region GD1 may be disposed in the first NMOS active region 121 which is located at one side of the first shared gate SG1 and opposite to the first n-type node doped region N1$n$. The other portion of the first shared gate SG1 may be disposed over the first NMOS active region 121 between the first n-type node doped region N1$n$ and the first ground doped region GD1. The first NMOS pass gate IPG1, the first n-type node doped region N1$n$ and the other portion of the first shared gate SG1 may be disposed between the second bit doped region BD2 and the first ground doped region GD1. The second bit doped region BD2, the first n-type node doped region N1$n$ and the first ground doped region GD1 may be doped with N-type dopants.

Similarly, a second p-type node doped region N2$p$ may be disposed in the second PMOS active region 112 between the second PMOS pass gate OPG2 and the second shared gate SG2. A first bit bar doped region BDB1 may be disposed in the second PMOS active region 112 which is located at one side of the second PMOS pass gate OPG2 and opposite to the second p-type node doped region N2$p$. The second PMOS pass gate OPG2 may be disposed over the second PMOS active region 112 between the second p-type node doped region N2$p$ and the first bit bar doped region BDB1. A second power doped region PD2 may be disposed in the second PMOS active region 112 that is located at one side of the second shared gate SG2 and opposite to the second p-type node doped region N2$p$. That is, a portion of the second shared gate SG2 may be disposed over the second PMOS active region 112 between the second p-type node doped region. N2$p$ and the second power doped region PD2. The second PMOS pass gate OPG2, the second p-type node doped region N2$p$ and the portion of the second shared gate SG2 may be disposed between the first bit bar doped region BDB1 and the second power doped region PD2. The first bit bar doped region BDB1, the second p-type node doped region N2$p$ and the second power doped region PD2 may be doped with P-type dopants.

A second n-type node doped region N2$n$ may be disposed in the second NMOS active region 122 between the second NMOS pass gate IPG2 and the second shared gate SG2. A second bit bar doped region BDB2 may be disposed in the second NMOS active region 122 which is located at one side of the second NMOS pass gate IPG2 and opposite to the second n-type node doped region N2n. The second NMOS pass gate IPG2 may be disposed over the second NMOS active region 122 between the second n-type node doped region N2n and the second bit bar doped region BDB2. A second ground doped region GD2 may be disposed in the second NMOS active region 122 which is located at one side of the second shared gate SG2 and opposite to the second n-type node doped region N2n. The other portion of the second shared gate SG2 may be disposed over the second NMOS active region 122 between the second n-type node doped region N2n and the second ground doped region GD2. The second NMOS pass gate IPG2, the second n-type node doped region N2n and the other portion of the second shared gate SG2 may be disposed between the second bit bar doped region BDB2 and the second ground doped region GD2. The second bit bar doped region BDB2, the second n-type node doped region N2n and the second ground doped region GD2 may be doped with N-type dopants.

As illustrated in FIG. 2A, the first bit bar doped region BDB1 and the first bit doped region BD1 are point symmetric with respect to the central point C, and the second p-type node doped region N2p and the first p-type node doped region N1p are point symmetric with respect to the central point C. Further, the second power doped region PD2 and the first power doped region PD1 are point symmetric with respect to the central point C, and the second bit bar doped region BDB2 and the second bit doped region BD2 are point symmetric with respect to the central point C. Moreover, the second n-type node doped region N2n and the first n-type node doped region N1n are point symmetric with respect to the central point C, and the second ground doped region GD2 and the first ground doped region GD1 are point symmetric with respect to the central point C.

A first PMOS pass channel region may be defined in the first PMOS active region 111 under the first PMOS pass gate OPG1, and a first pull-up channel region may be defined in the first PMOS active region 111 under the first shared gate SG1. Further, a first NMOS pass channel region may be defined in the first NMOS active region 121 under the first NMOS pass gate IPG1, and a first pull-down channel region may be defined in the first NMOS active region 121 under the first shared gate SG1.

Similarly, a second PMOS pass channel region may be defined in the second PMOS active region 112 under the second PMOS pass gate OPG2, and a second pull-up channel region may be defined in the second PMOS active region 112 under the second shared gate SG2. Further, a second NMOS pass channel region may be defined in the second NMOS active region 122 under the second NMOS pass gate IPG2, and a second pull-down channel region may be defined in the second NMOS active region 122 under the second shared gate SG2.

In some embodiments, the first PMOS active region 111 may include a first portion having a first width W1 and a second portion having a second width W2. The first PMOS pass gate OPG1 may cross over the first portion of the first PMOS active region 111, and the first shared gate SG1 may cross over the second portion of the first PMOS active region 111. Thus, a channel width of the first PMOS pass channel region may be equal to the first width W1, and a channel width of the first pull-up channel region may be equal to the second width W2. The first width W1 may be different from the second width W2. In some embodiments, the first width W1 may be greater than the second width W2. The channel width of the first PMOS pass channel region may be greater than the channel width of the first pull-up channel region.

In some embodiments, the first NMOS active region 121 may include a first portion having a third width W3 and a second portion having a fourth width W4. The first NMOS pass gate IPG1 may cross over the first portion of the first NMOS active region 121, and the first shared gate SG1 may cross over the second portion of the first NMOS active region 121. Thus, a channel width of the first NMOS pass channel region may be equal to the third width W3, and a channel width of the first pull-down channel region may be equal to the fourth width W4. The third width W3 may be different from the fourth width W4. In some embodiments, the fourth width W4 may be greater than the third width W3. The channel width of the first pull-down channel region may be greater than the channel width of the first NMOS pass channel region.

In some embodiments, the first width W1 may be greater than the third width W3. The channel width of the first PMOS pass channel region may be greater than the channel width of the first NMOS pass channel region. In some embodiments, the fourth width W4 may be greater than the first width W1. The channel width of the first pull-down channel region may be greater than the channel width of the first PMOS pass channel region. In some embodiments, the third width W3 may be greater than the second width W2. The channel width of the first NMOS pass channel region may be greater than the channel width of the first pull-up channel region.

The second NMOS active region 122 and the first NMOS active region 121 are point symmetric with respect to the central point C, and the second PMOS active region 112 and the first PMOS active region 111 are point symmetric with respect to the central point C. The second PMOS active region 112 and the second NMOS active region 122 are point symmetric with the first PMOS active region 111 and the first NMOS active region 121, respectively, when viewed from a plan view. Thus, the second NMOS pass channel region and the second pull-down channel region defined in the second NMOS active region 122 may have substantially the same configurations as the first NMOS pass channel region and the first pull-down channel region, respectively. Similarly, the second PMOS pass channel region and the second pull-up channel region defined in the second PMOS active region 112 may have substantially the same configurations as the first PMOS pass channel region and the first pull-up channel region, respectively.

The first PMOS pass gate OPG1, the first bit doped region BD1 and the first p-type node doped region N1p may constitute the first PMOS pass transistor p-TP1 of FIG. 1. A portion of the first shared gate SG1 on the first PMOS active region 111, the first power doped region PD1 and the first p-type node doped region N1p may constitute the first pull-up transistor TD1 of FIG. 1. The first PMOS pass transistor p-TP1 may share the first p-type node doped region N1p with the first pull-up transistor TU1.

The first NMOS pass gate IPG1, the second bit doped region BD2 and the first n-type node doped region N1n may constitute the first NMOS pass transistor n-TP1 of FIG. 1. The other portion of the first shared gate SG1 on the first NMOS active region 121, the first ground doped region GD1 and the first n-type node doped region N1n may constitute the first pull-down transistor TD1 of FIG. 1. The first NMOS pass transistor n-TP1 may share the first n-type node doped region N1n with the first pull-down transistor TD1.

The second PMOS pass gate OPG2, the first bit bar doped region BDB1 and the second p-type node doped region N2p may constitute the second PMOS pass transistor p-TP2 of FIG. 1. A portion of the second shared gate SG2 on the second PMOS active region 112, the second power doped region PD2 and the second p-type node doped region N2p may constitute the second pull-up transistor TU2 of FIG. 1. The second PMOS pass transistor p-TP2 may share the second p-type node doped region N2p with the second pull-up transistor TU2.

The second NMOS pass gate IPG2, the second bit bar doped region BDB2 and the second n-type node doped region N2n may constitute the second NMOS pass transistor n-TP2 of FIG. 1. The other portion of the second shared gate SG2 on the second NMOS active region 122, the second ground doped region GD2 and the second n-type node doped region N2n may constitute the second pull-down transistor TD2 of FIG. 1. The second NMOS pass transistor n-TP2 may share the second n-type node doped region N2n with the second pull-down transistor TD2.

The first pull-up transistor TU1 and the first pull-down transistor TD1 share the first shared gate SG1. Similarly, the second pull-up transistor TU2 and the second pull-down transistor TD2 share the second shared gate SG2. The first p-type node doped region N1p and the first n-type node doped region N1n may constitute the first node N1 of FIG. 1, and the second p-type node doped region N2p and the second n-type node doped region N2n may constitute the second node N2 of FIG. 1.

The semiconductor substrate 100 may include a silicon substrate, a germanium substrate or a silicon-germanium substrate. The isolation pattern 107 may be formed using a trench isolation technique. The isolation pattern 107 may include an oxide material, a nitride material and/or an oxynitride material. The gate dielectric layer 125 may include an oxide material, a nitride material, an oxynitride material and/or a high-k dielectric material (e.g., an insulating metal oxide layer such as a hafnium oxide layer or an aluminum oxide layer). The gates OPG1, IPG1, SG1, OPG2, IPG2 and SG2 may include a conductive material. For example, the gates OPG1, IPG1, SG1, OPG2, IPG2 and SG2 may include at least one of a doped semiconductor layer (e.g., a doped silicon layer, a doped germanium layer or a doped silicon-germanium layer), a metal layer (e.g., a tungsten layer or an aluminum layer), a metal-semiconductor compound layer (e.g., a metal silicide layer), a conductive metal nitride layer (e.g., a titanium nitride layer, a tantalum nitride layer or a tungsten nitride layer) and a transition metal layer (e.g., a titanium layer or a tantalum layer).

Figure 3A:
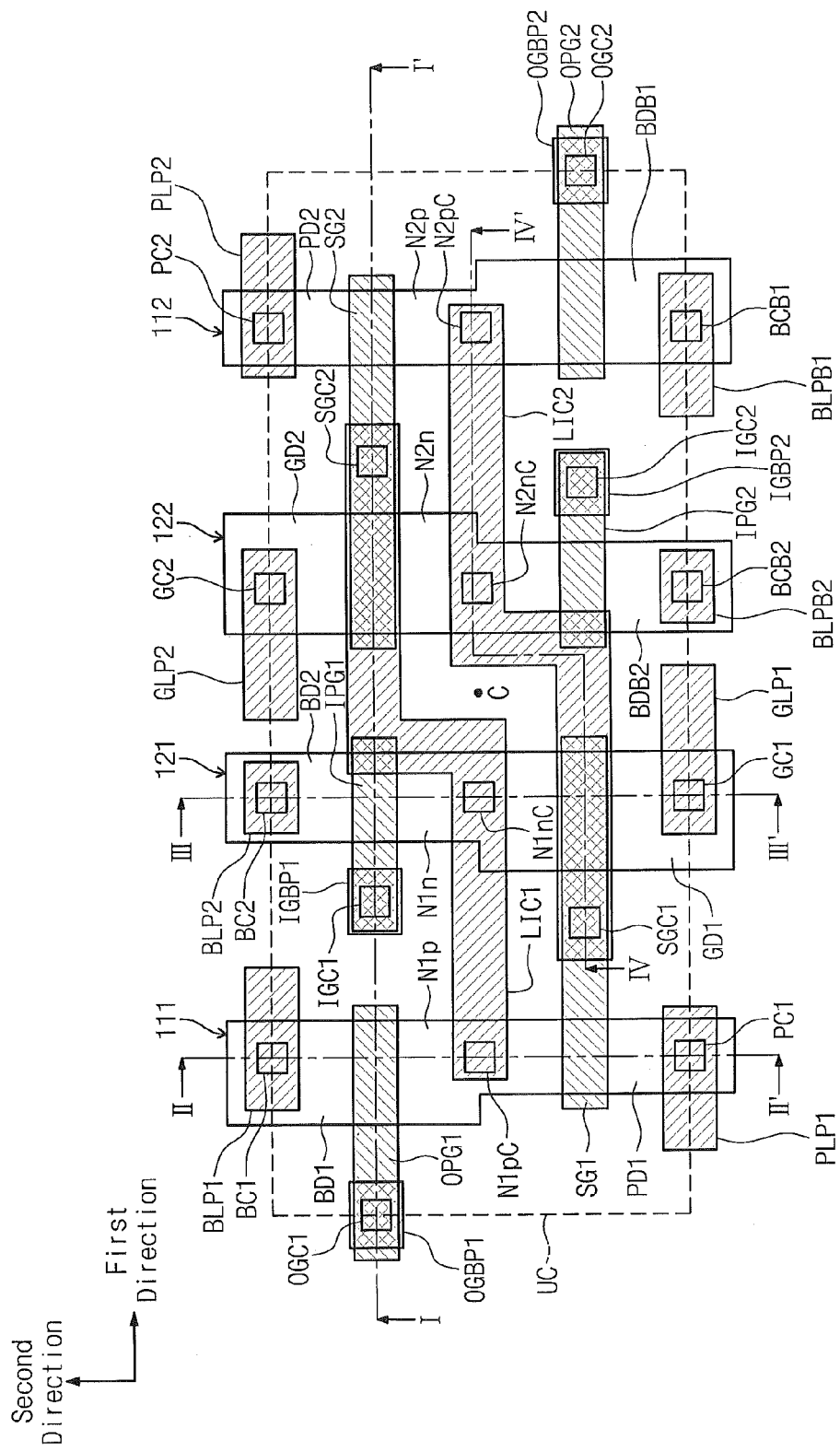
FIG. 3A is a plan view illustrating local interconnections of an SRAM cell according to some embodiments of the inventive subject matter.
Figure 3B:
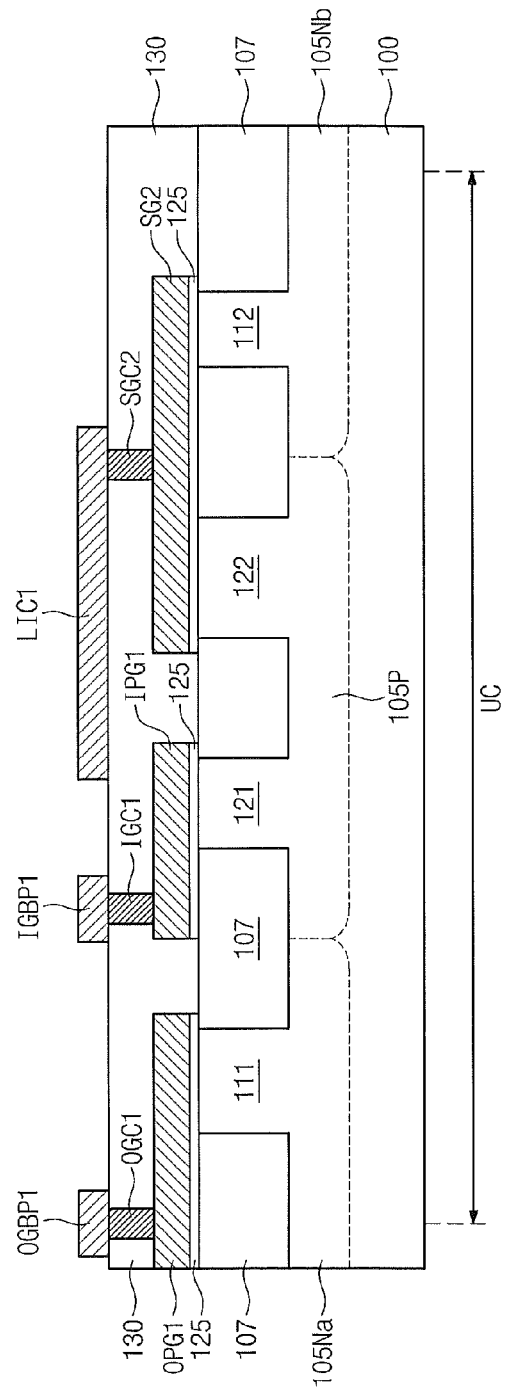
FIG. 3B is a cross sectional view taken along a line I-I' of FIG. 3A.
Figure 3C:
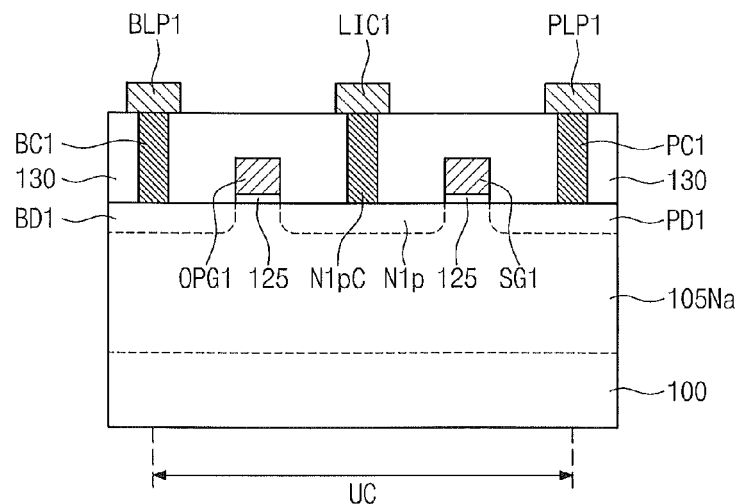
FIG. 3C is a cross sectional view taken along a line II-II' of FIG. 3A.
Figure 3D:
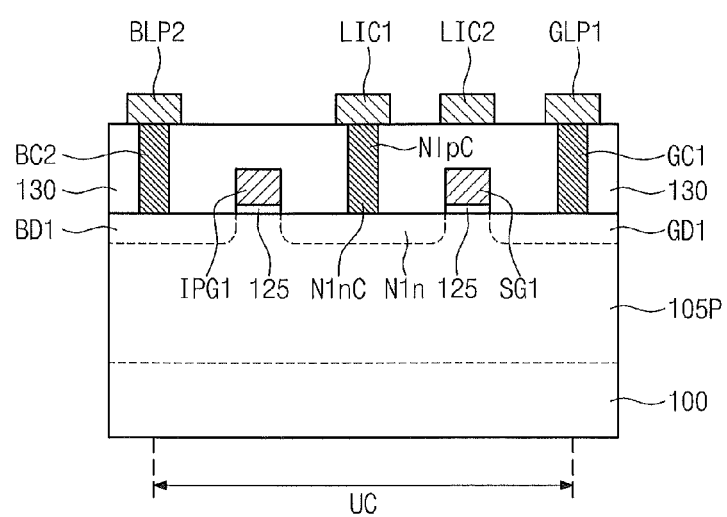
FIG. 3D is a cross sectional view taken along a line III-III' of FIG. 3A.
Figure 3E:
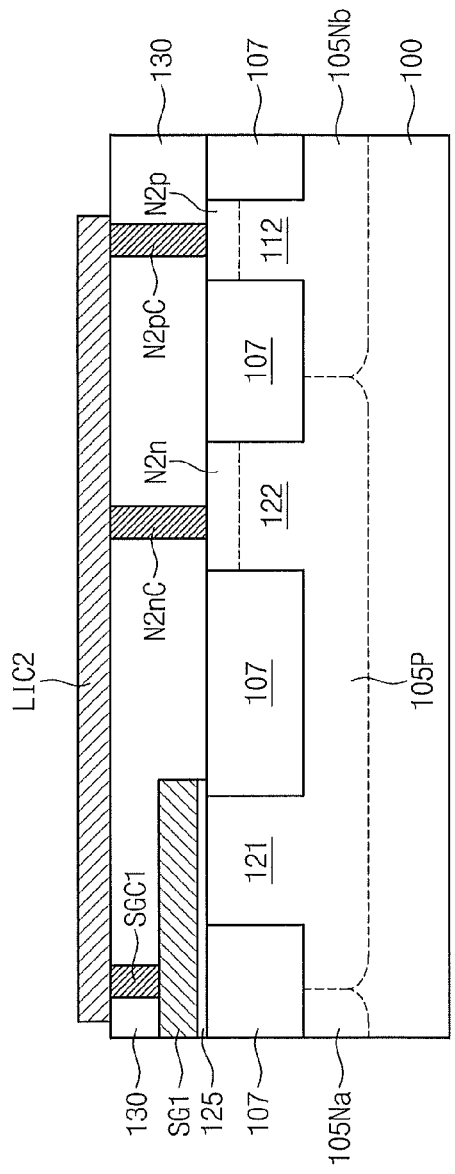
FIG. 3E is a cross sectional view taken along a line IV-IV' of FIG. 3A.

FIG. 3A is a plan view illustrating local interconnections of an SRAM cell according to some embodiments of the inventive subject matter, FIG. 3B is a cross sectional view taken along a line I-I' of FIG. 3A, and FIG. 3C is a cross sectional view taken along a line II-II' of FIG. 3A. Further, FIG. 3D is a cross sectional view taken along a line III-III' of FIG. 3A, and FIG. 3E is a cross sectional view taken along a line IV-IV' of FIG. 3A.

Referring to FIGS. 3A to 3E, the first p-type node doped region N1p, the first n-type node doped region N1n and the second shared gate SG2 may be electrically connected to each other through a first local interconnection LIC1. Similarly, the second p-type node doped region N2p, the second n-type node doped region N2n and the first shared gate SG1 may be electrically connected to each other through a second local interconnection LIC2.

Specifically, a first interlayer dielectric layer 130 may be disposed on the substrate including the gates OPG1, IPG1, SG1, OPG2, IPG2 and SG2 and the active regions 111, 112, 121 and 122. The first p-type node doped region N1p and the first n-type node doped region N1n may be electrically connected to a first p-type node plug N1pC and a first n-type node plug N1nC that penetrate the first interlayer dielectric layer 130, respectively. The second p-type node doped region N2p and the second n-type node doped region N2n may be electrically connected to a second p-type node plug N2pC and a second n-type node plug N2nC that penetrate the first interlayer dielectric layer 130, respectively. The first shared gate SG1 and the second shared gate SG2 may be electrically connected to a first sharing plug SGC1 and a second sharing plug SGC2 that penetrate the first interlayer dielectric layer 130, respectively.

The first and second local interconnections LIC1 and LIC2 may be disposed on the first interlayer dielectric layer 130 opposite to the substrate 100. The first local interconnection LIC1 may be electrically connected to the first p-type node plug N1pC, the first n-type node plug N1nC and the second sharing plug SGC2. The second local interconnection LIC2 may be electrically connected to the second p-type node plug N2pC, the second n-type node plug N2nC and the first sharing plug SGC1.

The first bit doped region BD1, the second bit doped region BD2, the first power doped region PD1 and the first ground doped region GD1 may be electrically connected to a first bit plug BC1, a second bit plug BC2, a first power plug PC1 and a first ground plug GC1 that penetrate the first interlayer dielectric layer 130, respectively. The first bit bar doped region BDB1, the second bit bar doped region BDB2, the second power doped region PD2 and the second ground doped region GD2 may be electrically connected to a first bit bar plug BCB1, a second bit bar plug BCB2, a second power plug PC2 and a second ground plug GC2 that penetrate the first interlayer dielectric layer 130, respectively. The first PMOS pass gate OPG1, the first NMOS pass gate IPG1, the second PMOS pass gate OPG2 and the second NMOS pass gate IPG2 may be electrically connected to a first PMOS pass plug OGC1, a first NMOS pass plug IGC1, a second PMOS pass plug OGC2 and a second NMOS pass plug IGC2 that penetrate the first interlayer dielectric layer 130, respectively.

A first bit landing pad BLP1, a second bit landing pad BLP2, a first power landing pad PLP1 and a first ground landing pad GLP1 may be disposed on the first interlayer dielectric layer 130 opposite to the substrate 100. The first bit landing pad BLP1, the second bit landing pad BLP2, the first power landing pad PLP1 and the first ground landing pad GLP1 may be electrically connected to the first bit plug BC, the second bit plug BC2, the first power plug PC1 and the first ground plug GC1, respectively. The first bit landing pad BLP1, the second bit landing pad BLP2, the first power landing pad PLP1 and the first ground landing pad GLP1 may have various planar shapes according to the layouts of lines to be described later.

A first bit bar landing pad BLPB1, a second bit bar landing pad BLPB2, a second power landing pad PLP2 and a second ground landing pad GLP2 may be disposed on the first interlayer dielectric layer 130. The first bit bar landing pad BLPB1, the second bit bar landing pad BLPB2, the second power landing pad PLP2 and the second ground landing pad GLP2 may be electrically connected to the first bit bar plug BCB1, the second bit bar plug BCB2, the second power plug PC2 and the second ground plug GC2, respectively. The first bit bar landing pad BLPB1, the second bit bar landing pad BLPB2, the second power landing pad PLP2 and the second ground landing pad GLP2 may also have various planar shapes according to the layouts of lines to be described later.

A first PMOS pass buffer pad OGBP1, a first NMOS pass buffer pad IGBP1, a second PMOS pass buffer pad OGBP2 and a second NMOS pass buffer pad IGBP2 may be disposed on the first interlayer dielectric layer 130. The first PMOS pass buffer pad OGBP1, the first NMOS pass buffer pad IGBP1, the second PMOS pass buffer pad OGBP2 and the second NMOS pass buffer pad IGBP2 may be electrically connected to the first PMOS pass plug OGC1, the first NMOS pass plug IGC1, the second PMOS pass plug OGC2 and the second NMOS pass plug IGC2, respectively.

The landing pads BLP1, BLP2, PLP1, GLP1, BLPB1, BLPB2, PLP2 and GLP2 and the buffer pads OGBP1, IGBP1, OGBP2 and IGBP2 may be located at the same level as the local interconnections LIC1 and LIC2 from a top surface of the semiconductor substrate 100. The landing pads BLP1, BLP2, PLP1, GLP1, BLPB1, BLPB2, PLP2 and GLP2, the buffer pads OGBP1, IGBP1, OGBP2 and IGBP2, and the local interconnections LIC1 and LIC2 may be laterally separated from each other.

The SRAM cell denoted by the dotted line UC may share the plugs OGC1, BC1, BC2, GC2, PC2, OGC2, BCB1, BCB2, GC1 and PC1, the landing pads BLP1, BLP2, GLP2, PLP2, BLPB1, BLPB2, GLP1 and PLP1, and the buffer pads OGBP1 and OGBP2 overlapping with a border line (e.g., the dotted line UC of FIG. 3A) with the neighbor SRAM cells.

The local interconnections LIC1 and LIC2 may be formed of a conductive material that exhibits an ohmic contact characteristic to both a P-type region and an N-type region. For example, the local interconnections LIC1 and LIC2 may include at least one of a metal layer (e.g., a tungsten layer or an aluminum layer), a conductive metal nitride (e.g., a titanium nitride layer, a tantalum nitride layer or a tungsten nitride layer) and a transition metal layer (e.g., a titanium layer or a tantalum layer). The landing pads BLP1, BLP2, GLP2, PLP2, BLPB1, BLPB2, GLP1 and PLP1 and the buffer pads OGBP1 and OGBP2 may be formed of the same conductive material as the local interconnections LIC1 and LIC2.

The plugs BC1, BC2, N1$p$C, N1$n$C, PC1, GC1, OGC1, IGC1, SGC1, BCB1, BCB2, N2$p$C, N2$n$C, PC2, GC2, OGC2, IGC2 and SGC2 may be formed of a same material. For example, the plugs BC1, BC2, N1$p$C, N1$n$C, PC1, GC1, OGC1, IGC1, SGC1, BCB1, BCB2, N2$p$C, N2$n$C, PC2, GC2, OGC2, IGC2 and SGC2 may include at least one of a doped semiconductor layer (e.g., a doped silicon layer), a metal layer (e.g., a tungsten layer or an aluminum layer), a conductive metal nitride layer (e.g., a titanium nitride layer, a tantalum nitride layer or a tungsten nitride layer), a transition metal layer (e.g., a titanium layer or a tantalum layer) and a metal-semiconductor compound layer (e.g., a metal silicide layer).

Figure 4A:
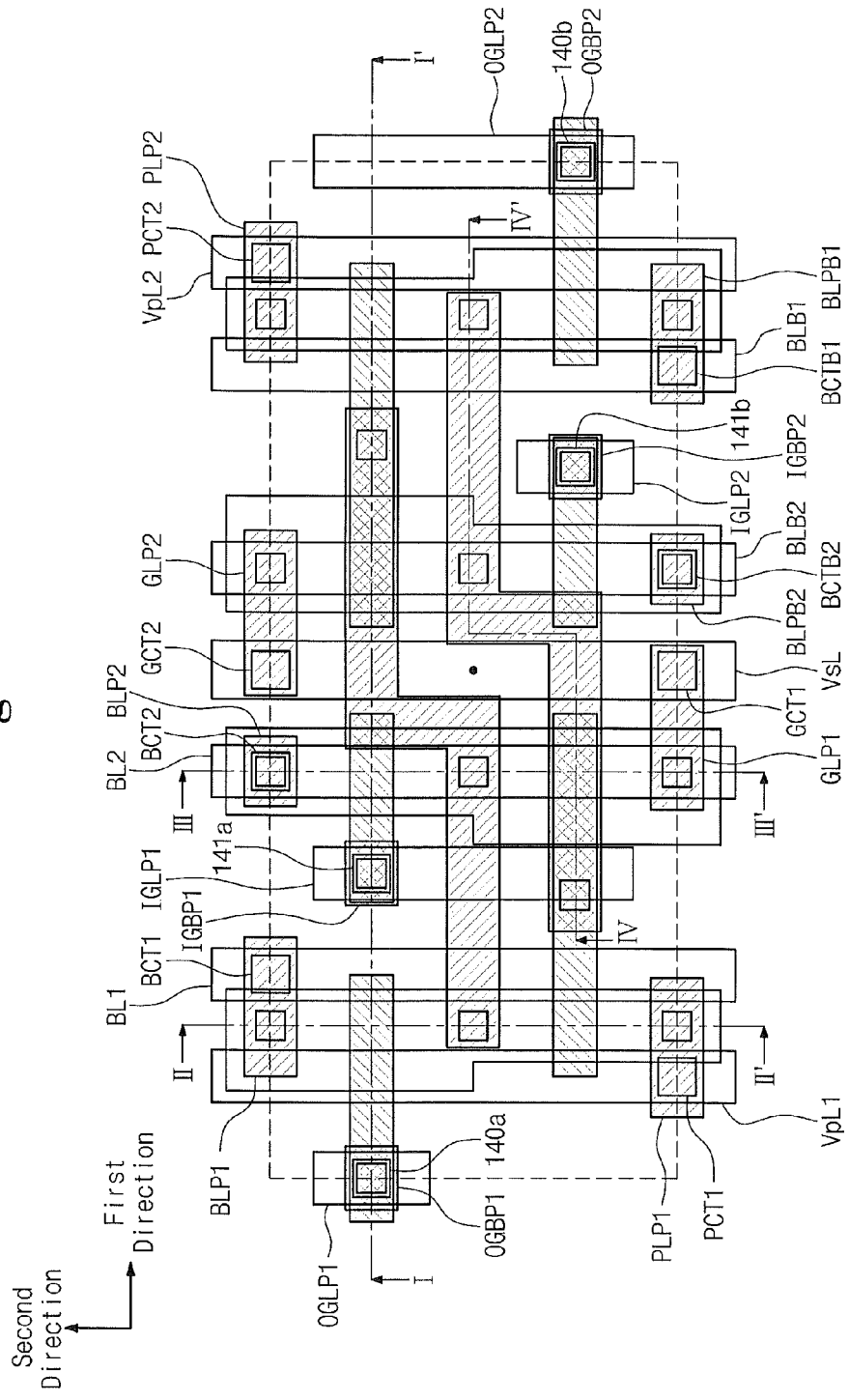
FIG. 4A is a plan view illustrating power lines, ground lines, bit lines and bit bar lines of an SRAM cell according to some embodiments of the inventive subject matter.
Figure 4C:
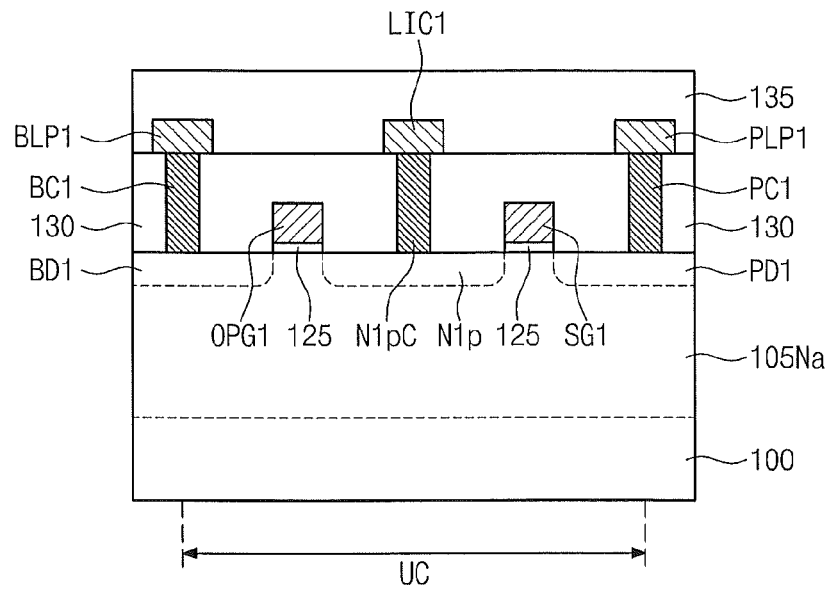
FIG. 4C is a cross sectional view taken along a line II-II' of FIG. 4A.
Figure 4D:
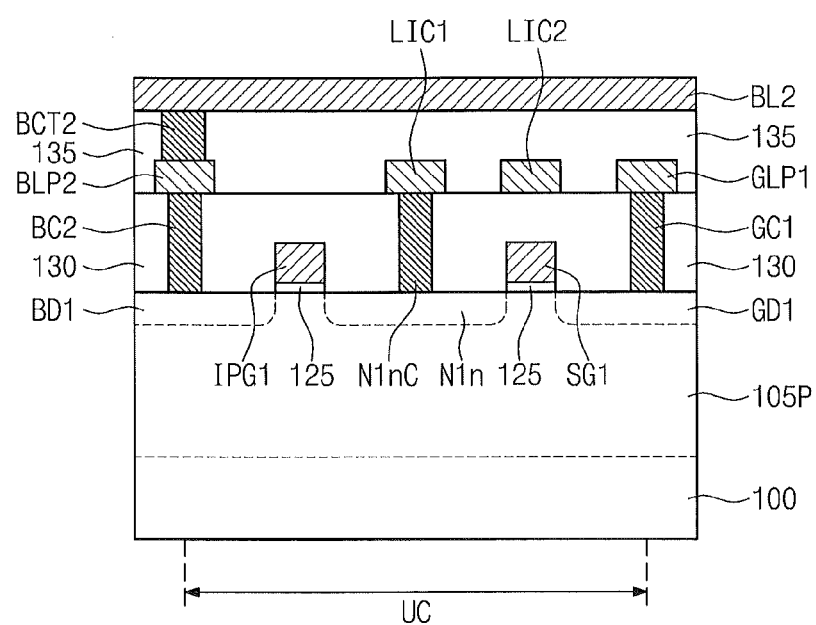
FIG. 4D is a cross sectional view taken along a line III-III' of FIG. 4A.
Figure 4E:
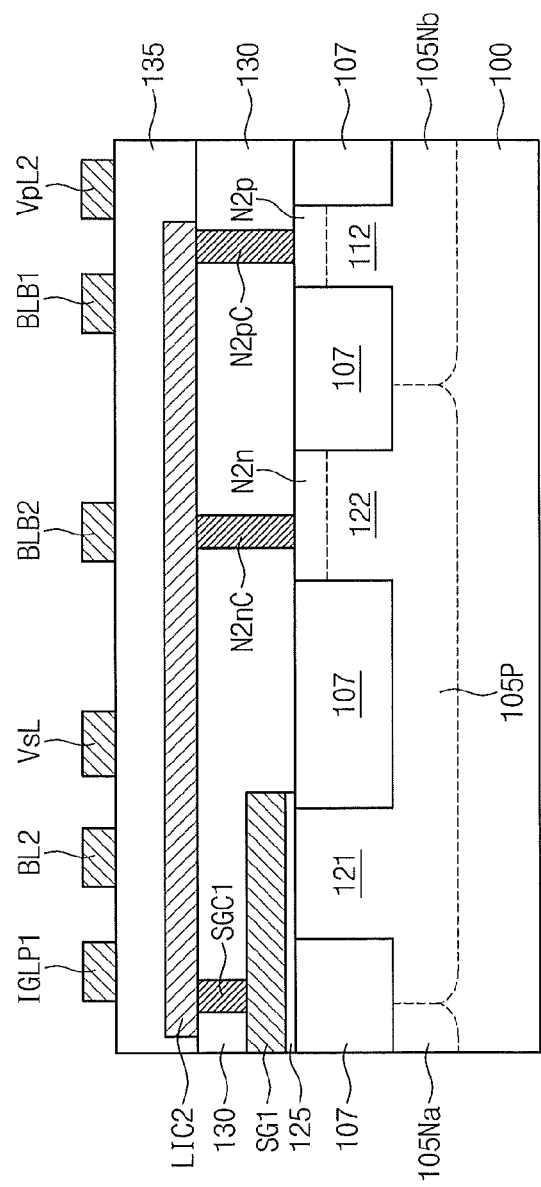
FIG. 4E is a cross sectional view taken along a line IV-IV' of FIG. 4A.

FIG. 4A is a plan view illustrating power lines, ground lines, bit lines and bit bar lines of an SRAM cell according to some embodiments of the inventive subject matter, FIG. 4B is a cross sectional view taken along a line I-I' of FIG. 4A, and FIG. 4C is a cross sectional view taken along a line II-II' of FIG. 4A. In addition, FIG. 4D is a cross sectional view taken along a line III-III' of FIG. 4A, and FIG. 4E is a cross sectional view taken along a line IV-IV' of FIG. 4A.

Referring to FIGS. 4A to 4E, a plurality of lines VpL1, BL1, BL2, VsL, BLB2, BLB1 and VpL2 may be disposed over the local interconnections LIC1 and LIC2. The first power line VpL1 and the second power line VpL2 may be electrically connected to the first power landing pad PLP1 and the second power landing pad PLP2, respectively. As such, the first power line VpL1 and the second power line VpL2 may be electrically connected to the first power doped region PD1 and the second power doped region PD2 illustrated in FIG. 2A (or FIG. 3A), respectively. The first bit line BL1 and the first bit bar line BLB1 may be electrically connected to the first bit landing pad BLP1 and the first bit bar landing pad BLPB1, respectively. As such, the first bit line BL1 and the first bit bar line BLB1 may be electrically connected to the first bit doped region BD1 and the first bit bar doped region BDB1 illustrated in FIG. 2A (or FIG. 3A), respectively. The second bit line BL2 and the second bit bar line BLB2 may be electrically connected to the second bit landing pad BLP2 and the second bit bar landing pad BLPB2 illustrated in FIG. 2A (or FIG. 3A), respectively. Thus, the second bit line BL2 and the second bit bar line BLB2 may be electrically connected to the second bit doped region BD2 and the second bit bar doped region BDB2 illustrated in FIG. 2A (or FIG. 3A), respectively. The ground line VsL may be electrically connected to the first ground landing pad GLP1 and the second ground landing pad GLP2. Thus, the ground line VsL may be electrically connected to the first and second ground doped regions GD1 and GD2 illustrated in FIG. 2A (or FIG. 3A), respectively.

As illustrated in FIGS. 4B to 4E, a second interlayer dielectric layer 135 may be disposed on the first interlayer dielectric layer 130, the local interconnections LIC1 and LIC2, the landing pads BLP1, BLP2, PLP1, BLPB1, BLPB2, PLP2, GLP2, and the buffer pads OGBP1, IGBP1, OGBP2 and IGBP2. The lines VpL1, BL1, BL2, VsL, BLB2, BLB1 and VpL2 may be disposed on the second interlayer dielectric layer 135. In some embodiments, the lines VpL1, BL1, BL2, VsL, BLB2, BLB1 and VpL2 may be located at a same level from a top surface of the semiconductor substrate 100.

As illustrated in FIG. 4A, the lines VpL1, BL1, BL2, VsL, BLB2, BLB1 and VpL2 may extend in parallel in the second direction. The first bit line BL1 and the first bit bar line BLB1 may be disposed between the first power line VpL1 and the second power line VpL2. The second bit line BL2 and the second bit bar line BLB2 may be disposed between the first bit line BL1 and the first bit bar line BLB1. The ground line VsL may be disposed between the second bit line BL2 and the second bit bar line BLB2.

Referring again to FIGS. 4A to 4E, the first bit landing pad BLP1 and the first bit bar landing pad BLPB1 may be electrically connected to a first bit landing plug BCT1 and a first bit bar landing plug BCTB1 that penetrate the second interlayer dielectric layer 135, respectively. The first bit line BL1 and the first bit bar line BLB1 may be electrically connected to the first bit landing plug BCT1 and the first bit bar landing plug BCTB1, respectively.

The second bit landing pad BLP2 and the second bit bar landing pad BLPB2 may be electrically connected to a second bit landing plug BCT2 and a second bit bar landing plug BCTB2 that penetrate the second interlayer dielectric layer 135, respectively. The second bit line BL2 and the second bit bar line BLB2 may be electrically connected to the second bit landing plug BCT2 and the second bit bar landing plug BCTB2, respectively.

The first power landing pad PLP1 and the second power landing pad PLP2 may be electrically connected to a first power landing plug PCT1 and a second power landing plug PCT2 that penetrate the second interlayer dielectric layer 135, respectively. The first power line VpL1 and the second power line VpL2 may be electrically connected to the first power landing plug PCT1 and the second power landing plug PCT2, respectively.

The first ground landing pad GLP1 and the second ground landing pad GLP2 may be electrically connected to a first ground landing pad GCT1 and a second ground landing pad GCT2 that penetrate the second interlayer dielectric layer 135, respectively. The ground line VsL may be electrically connected to the first ground landing pad GCT1 and the second ground landing pad GCT2.

A first PMOS pass landing pad OGLP1, a second PMOS pass landing pad OGLP2, a first NMOS pass landing pad IGLP1 and a second NMOS pass landing pad IGLP2 may be disposed on the second interlayer dielectric layer 135. The first PMOS pass landing pad OGLP1 may be electrically connected to the first PMOS pass buffer pad OGBP 1 through a first PMOS pass buffer plug 140a penetrating the second interlayer dielectric layer 135. The second PMOS pass landing pad OGLP2 may be electrically connected to the second PMOS pass buffer pad OGBP2 through a second PMOS pass buffer plug 140b penetrating the second interlayer dielectric layer 135. The first NMOS pass landing pad IGLP1 may be electrically connected to the first NMOS pass buffer pad IGBP1 through a first NMOS pass buffer plug 141a penetrating the second interlayer dielectric layer 135. The second NMOS pass landing pad IGLP2 may be electrically connected to the second NMOS pass buffer pad IGBP2 through a second NMOS pass buffer plug 141b penetrating the second interlayer dielectric layer 135.

The first PMOS pass landing pad OGLP1, the second PMOS pass landing pad OGLP2, the first NMOS pass landing pad IGLP1 and the second NMOS pass landing pad IGLP2 may have various planar shapes for appropriate layouts of word lines WL1 and WL2 to be described later. For example, as illustrated in FIG. 4A, the second PMOS pass landing pad OGLP2 may extend in the second direction. The extended portion of the second PMOS pass landing pad OGLP2 may overlap with the first PMOS pass buffer plug 140a in the first direction. Similarly, the first NMOS pass landing pad IGLP1 may also extend in the second direction. The extended portion of the first NMOS pass landing pad IGLP1 may overlap with the second NMOS pass buffer plug 140b in the first direction. The first PMOS pass landing pad OGLP1, the second PMOS pass landing pad OGLP2, the first NMOS pass landing pad IGLP1 and the second NMOS pass landing pad IGLP2 may be located at the same level as the lines VpL1, BL1, BL2, VsL, BLB2, BLB1 and VpL2 from a top surface of the semiconductor substrate 100.

The lines VpL1, BL1, BL2, VsL, BLB2, BLB1 and VpL2 may include a conductive material. For example, the lines VpL1, BL1, BL2, VsL, BLB2, BLB1 and VpL2 may include at least one of a metal layer (e.g., a tungsten layer, an aluminum layer or a copper layer), a conductive metal nitride (e.g., a titanium nitride layer, a tantalum nitride layer or a tungsten nitride layer) and a transition metal layer (e.g., a titanium layer or a tantalum layer). The first PMOS pass landing pad OGLP1, the second PMOS pass landing pad OGLP2, the first NMOS pass landing pad IGLP1 and the second NMOS pass landing pad IGLP2 may include the same conductive material as the lines VpL1, BL1, BL2, VsL, BLB2, BLB1 and VpL2.

The landing plugs BCT1, BCTB1, BCT2, BCTB2, PCT1, PCT2, GCT1 and GCT2 may be formed of a conductive material. For example, the landing plugs BCT1, BCTB1, BCT2, BCTB2, PCT1, PCT2, GCT1 and GCT2 may include at least one of a metal layer (e.g., a tungsten layer, an aluminum layer or a copper layer), a conductive metal nitride (e.g., a titanium nitride layer, a tantalum nitride layer or a tungsten nitride layer) and a transition metal layer (e.g., a titanium layer or a tantalum layer). The buffer plugs 140a, 140b, 141a and 141b may include the same material as the landing plugs BCT1, BCTB1, BCT2, BCTB2, PCT1, PCT2, GCT1 and GCT2.

Figure 5A:
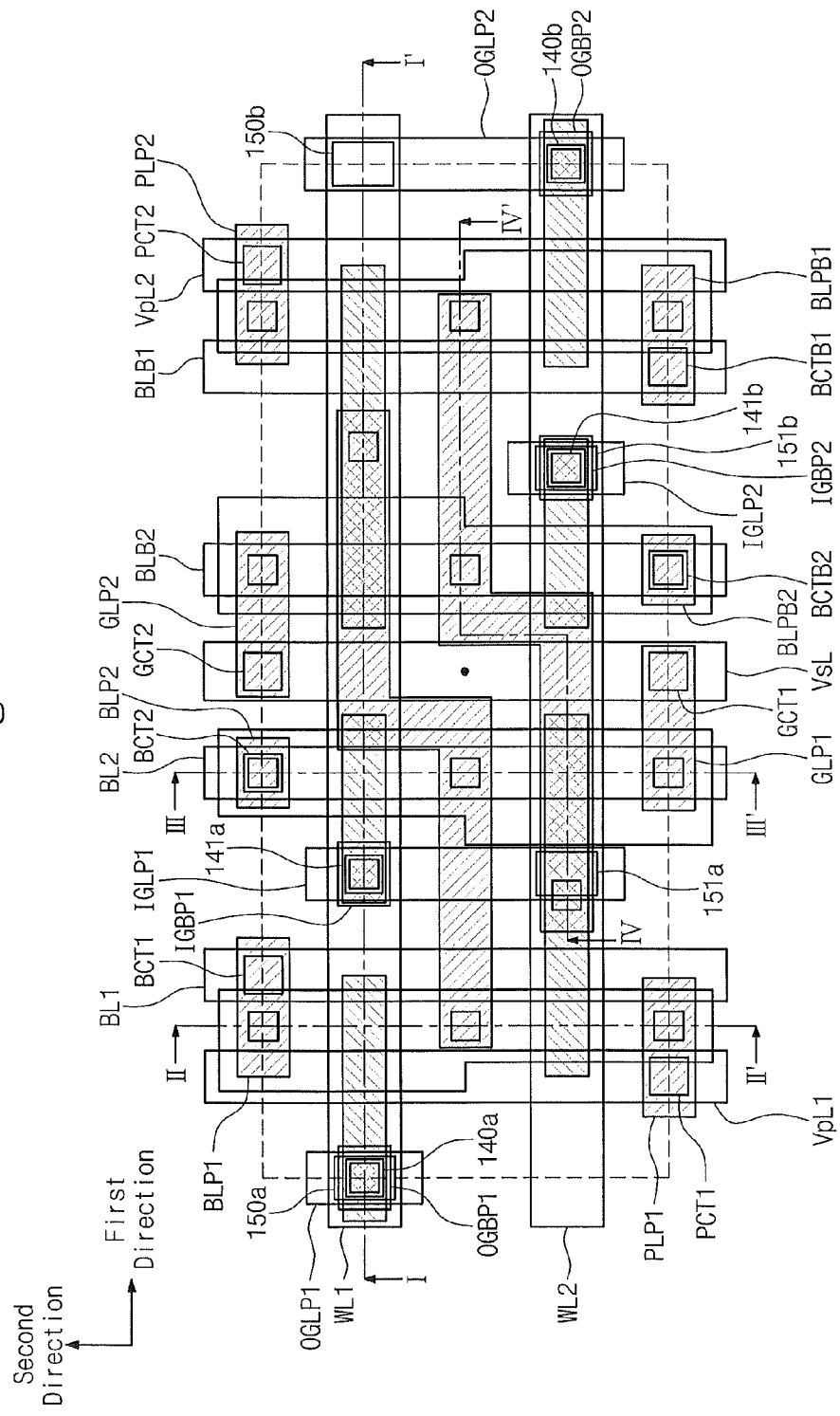
FIG. 5A is a plan view illustrating word lines of an SRAM cell according to some embodiments of the inventive subject matter.
Figure 5B:
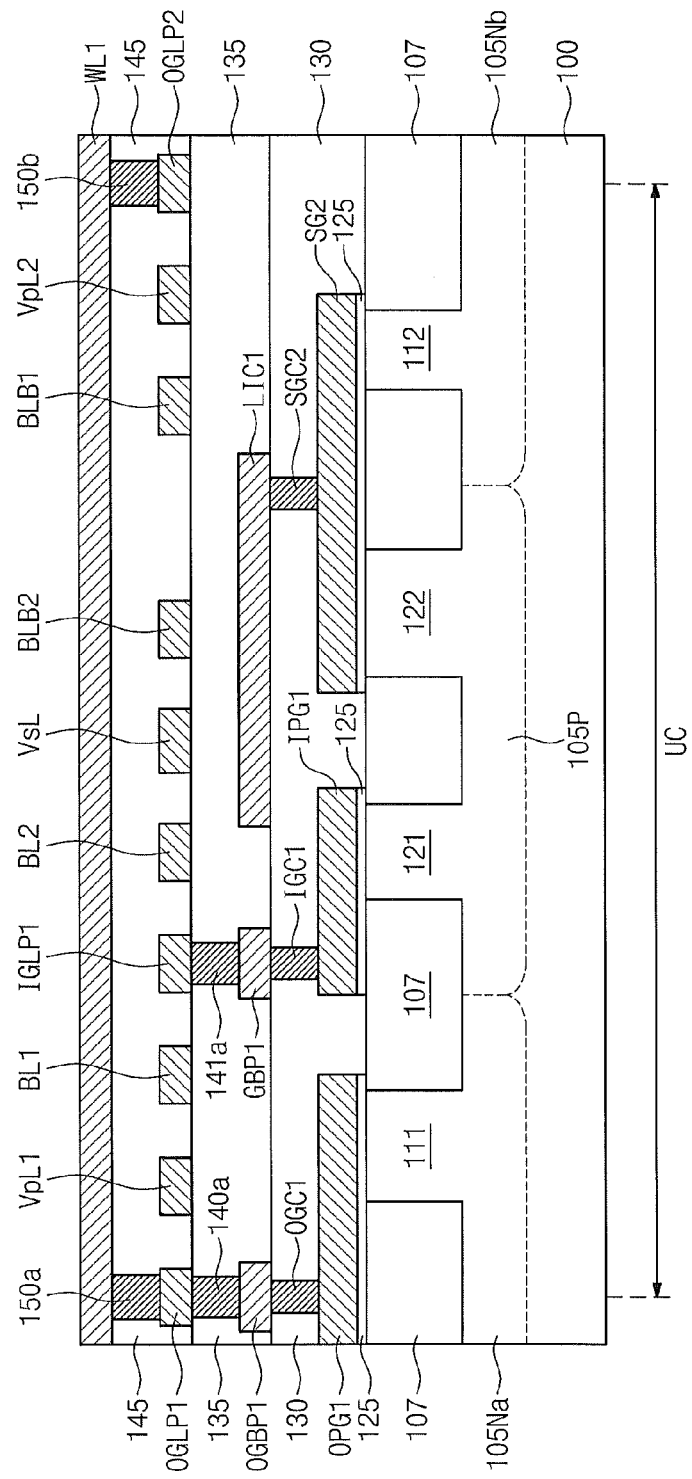
FIG. 5B is a cross sectional view taken along a line I-I' of FIG. 5A.
Figure 5C:
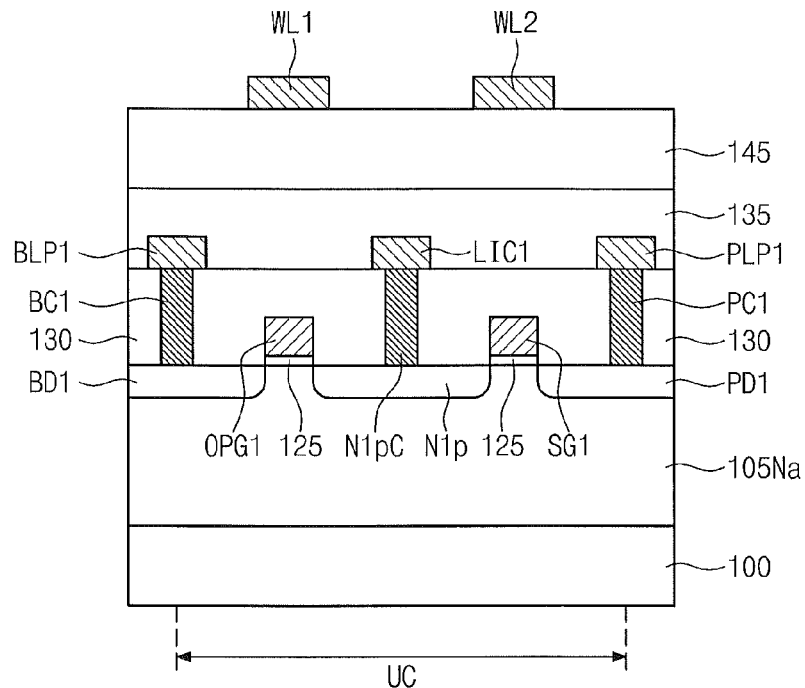
FIG. 5C is a cross sectional view taken along a line II-II' of FIG. 5A.
Figure 5D:
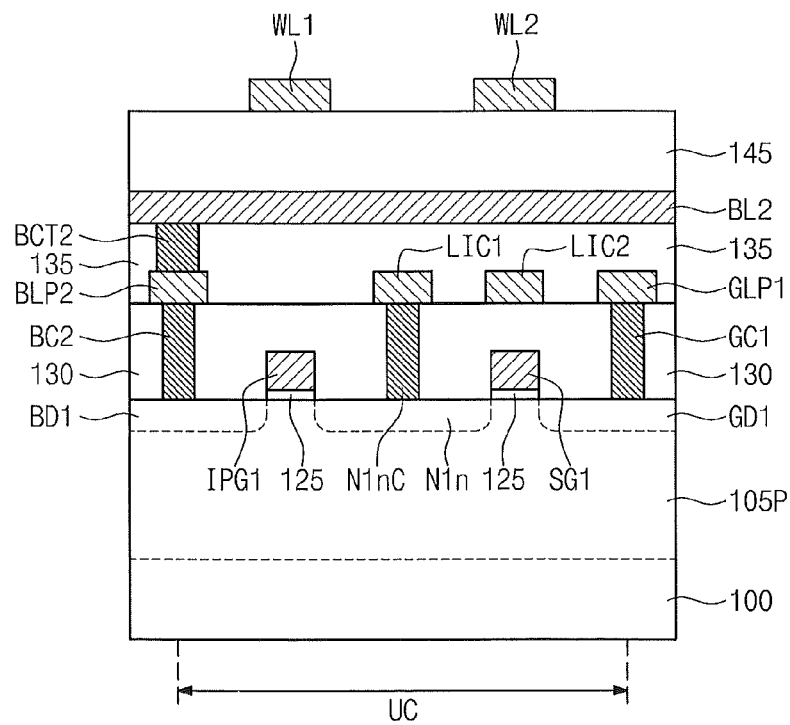
FIG. 5D is a cross sectional view taken along a line III-III' of FIG. 5A.

FIG. 5A is a plan view illustrating word lines of an SRAM cell according to some embodiments of the inventive subject matter, FIG. 5B is a cross sectional view taken along a line I-I' of FIG. 5A, and FIG. 5C is a cross sectional view taken along a line II-II' of FIG. 5A. In addition, FIG. 5D is a cross sectional view taken along a line III-III' of FIG. 5A, and FIG. 5E is a cross sectional view taken along a line IV-IV' of FIG. 5A.

Referring to FIGS. 5A to 5E, a first word line WL1 may be electrically connected to the first PMOS pass gate OPG1 and the second PMOS pass gate OPG2. A second word line WL2 may be electrically connected to the first NMOS pass gate IPG1 and the second NMOS pass gate IPG2.

In more detail, a third interlayer dielectric layer 145 may be disposed on the lines VpL1, BL1, BL2, VsL, BLB2, BLB1 and VpL2, the pass landing pads OGLP1, OGLP2, IGLP1 and IGLP2, and the second interlayer dielectric layer 135. The first and second word lines WL1 and WL2 may be disposed on the third interlayer dielectric layer 145. In some embodiments, the first and second word lines WL1 and WL2 may be located at a same level from a top surface of the semiconductor substrate 100.

The first PMOS pass landing pad OGLP1 and the second PMOS pass landing pad OGLP2 may be electrically connected to a first PMOS pass landing plug 150a and a second PMOS pass landing plug 150b that penetrate the third interlayer dielectric layer 145, respectively. The first word line WL1 may be electrically connected to the first and second PMOS pass landing plugs 150a and 150b. The first NMOS pass landing pad IGLP1 and the second NMOS pass landing pad IGLP2 may be electrically connected to a first NMOS pass landing plug 151a and a second NMOS pass landing plug 151b that penetrate the third interlayer dielectric layer 145, respectively. The second word line WL2 may be electrically connected to the first and second NMOS pass landing plugs 151a and 151b.

The word lines WL1 and WL2 may include a conductive material. For example, the word lines WL1 and WL2 may include at least one of a metal layer (e.g., a tungsten layer, an aluminum layer or a copper layer), a conductive metal nitride (e.g., a titanium nitride layer, a tantalum nitride layer or a tungsten nitride layer) and a transition metal layer (e.g., a titanium layer or a tantalum layer). The pass landing plugs 150a, 150b, 151a and 151b may include a conductive material. For example, the pass landing plugs 150a, 150b, 151a and 151b may include at least one of a metal layer (e.g., a tungsten layer, an aluminum layer or a copper layer), a conductive metal nitride (e.g., a titanium nitride layer, a tantalum nitride layer or a tungsten nitride layer) and a transition metal layer (e.g., a titanium layer or a tantalum layer).

Each of the first, second and third interlayer dielectric layers 130, 135 and 145 may include an oxide layer, a nitride layer and/or an oxynitride layer.

According to the SRAM cell UC, the first PMOS pass transistor p-TP1 and the first pull-up transistor TU1 may be formed in and on the first PMOS active region 111, and the first NMOS pass transistor n-TP1 and the first pull-down transistor TD1 may be formed in and on the first NMOS active region 121. As such, an SRAM cell may be optimized to enhance the integration density thereof. Further, the SRAM cell UC may include a pair of PMOS pass transistors p-TP1 and p-TP2 as well as a pair of NMOS pass transistors n-TP1 and n-TP2, as described above. Thus, a high performance SRAM cell may be realized.

Moreover, the active regions 111, 112, 121 and 122 may be designed to have some different widths partially. In this case, it may be easy to control the characteristics of the transistors p-TP1, p-TP2, n-TP1, n-TP2, TU1, TU2, TD1 and TD2 constituting the SRAM cell UC.

The SRAM cells according to some embodiments of the inventive subject matter may be employed in semiconductor devices including SRAM devices and/or logic devices. The semiconductor devices including the SRAM cells according to embodiments described above may be encapsulated using various packaging techniques. For example, the semiconductor devices including the SRAM cells according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

In the embodiments set forth above, a first PMOS pass gate and a first shared gate may be disposed on a first PMOS active region, and a first NMOS pass gate and the first shared gate may be disposed on a first NMOS active region. As such, a pair of transistors may be formed in and on each of the first PMOS active region and the first NMOS active region. As a result, a compact SRAM cell may be realized to increase the integration density of a semiconductor device including the SRAM cells. Further, each of the SRAM cells includes a pair of NMOS pass transistors and a pair of PMOS pass transistors. Therefore, the SRAM cell may be realized to have a dual port. Thus, a high performance SRAM cell may be realized.

While the inventive subject matter has been described with reference to example embodiments, it will be apparent to those skilled in the art that various changes and modifications may be made without departing from the spirit and scope of the inventive subject matter. Therefore, it should be understood that the above embodiments are not limiting, but illustrative. Thus, the scope of the inventive subject matter is to be determined by the broadest permissible interpretation of the following claims and their equivalents, and shall not be restricted or limited by the foregoing description.

What is claimed is:
1. An SRAM cell comprising:
a first PMOS active region and a second PMOS active region defined in a semiconductor substrate;
a first NMOS active region and a second NMOS active region defined in the semiconductor substrate, the first and second NMOS active regions being disposed between the first PMOS active region and the second PMOS active region;
a first PMOS pass gate crossing Over the first PMOS active region;
a first NMOS pass gate crossing over the first NMOS active region;
a first shared gate crossing over the first PMOS active region and the first NMOS active region;
a second PMOS pass gate crossing over the second PMOS active region;
a second NMOS pass gate crossing over the second NMOS active region; and
a second shared gate crossing over the second PMOS active region and the second NMOS active region.
2. The SRAM cell of claim 1, wherein a channel width of a channel region defined in the first PMOS active region under the first PMOS pass gate is greater than a channel width of a channel region defined in the first PMOS active region under the first shared gate.

3. The SRAM cell of claim 1, wherein a channel width of a channel region defined in the first PMOS active region under the first PMOS pass gate is greater than a channel width of a channel region defined in the first NMOS active region under the first NMOS pass gate.
4. The SRAM cell of claim 1, wherein the second PMOS active region, the second NMOS active region, the second PMOS pass gate, the second NMOS pass gate and the second shared gate are respectively symmetric to the first PMOS active region, the first NMOS active region, the first PMOS pass gate, the first NMOS pass gate and the first shared gate with respect to a central point of a unit cell region, when viewed from a plan view.
5. The SRAM cell of claim 1, wherein the first PMOS pass gate, the first NMOS pass gate and the second shared gate are arrayed in a first direction to constitute a first row,
wherein the first shared gate, the second NMOS pass gate and the second PMOS pass gate are arrayed in the first direction to constitute a second row, and
wherein the first and second rows are separated from each other in a second direction perpendicular to the first direction.
6. The SRAM cell of claim 1, further comprising:
a first word line electrically connected to the first and second PMOS pass gates; and
a second word line electrically connected to the first and second NMOS pass gates,
wherein the first and second word lines are located at a same level from a top surface of the semiconductor substrate, and
wherein the first and second word lines extend in one direction.
7. The SRAM cell of claim 6, further comprising:
a first P-type node doped region disposed in the first PMOS active region between the first PMOS pass gate and the first shared gate;
a first N-type node doped region disposed in the first NMOS active region between the first NMOS pass gate and the first shared gate;
a first local interconnection electrically connecting the first P-type node doped region and the first N-type node doped region to the second shared gate;
a second P-type node doped region disposed in the second PMOS active region between the second PMOS pass gate and the second shared gate;
a second N-type node doped region disposed in the second NMOS active region between the second NMOS pass gate and the second shared gate; and
a second local interconnection electrically connecting the second P-type node doped region and the second N-type node doped region to the first shared gate.
8. The SRAM cell of claim 7, wherein the first and second local interconnections are located at a lower level than the first and second word lines from a top surface of the semiconductor substrate.
9. The SRAM cell of claim 6, further comprising:
a first bit doped region disposed in the first PMOS active region located at one side of the first PMOS pass gate;
a first power doped region disposed in the first PMOS active region located at one side of the first shared gate;
a first bit bar doped region disposed in the second PMOS active region located at one side of the second PMOS pass gate; and
a second power doped region disposed in the second PMOS active region located at one side of the second shared gate, wherein the first PMOS pass gate and the first shared gate are disposed between the first bit doped region and the first power doped region, and wherein the second PMOS pass gate and the second shared gate are disposed between the first bit bar doped region and the second power doped region.

10. The SRAM cell of claim 9, further comprising:
a first bit line electrically connected to the first bit doped region;
a first bit bar line electrically connected to the first bit bar doped region;
a first power line electrically connected to the first power doped region; and
a second power line electrically connected to the second power doped region,
wherein the first and second word lines intersect the first bit line, the first bit bar line, the first power line and the second power line.

11. The SRAM cell of claim 9, further comprising:
a second bit doped region disposed in the first NMOS active region located at one side of the first NMOS pass gate;
a first ground doped region disposed in the first NMOS active region located at one side of the first shared gate;
a second bit bar doped region disposed in the second NMOS active region located at one side of the second NMOS pass gate; and
a second ground doped region disposed in the second NMOS active region located at one side of the second shared gate,
wherein the first NMOS pass gate and the first shared gate are disposed between the second bit doped region and the first ground doped region, and
wherein the second NMOS pass gate and the second shared gate are disposed between the second bit bar doped region and the second ground doped region.

12. The SRAM cell of claim 11, further comprising:
a second bit line electrically connected to the second bit doped region;
a second bit bar line electrically connected to the second bit bar doped region; and
a ground line electrically connected to the first ground doped region and the second ground doped region,
wherein the first and second word lines intersect the second bit line, the second bit bar line and the ground line.

13. The SRAM cell of claim 11, wherein the first bit bar doped region, the second power doped region, the second bit bar doped region and the second ground doped region are respectively symmetric to the first bit doped region, the first power doped region, the second bit doped region and the first ground doped region with respect to a central point of a unit cell region, when viewed from a plan view.

14. An SRAM cell comprising:
elongate first and second PMOS active regions and elongate first and second NMOS active regions arranged in a row in a semiconductor substrate, the first and second NMOS active regions disposed between the first and second PMOS active regions;
a first PMOS pass transistor comprising a first gate electrode disposed on the first PMOS active region;
a first NMOS pass transistor comprising a second gate electrode disposed on the first NMOS active region;
a first PMOS pull-up transistor and a first NMOS pull-down transistor sharing a third gate electrode disposed on the first PMOS active region and the first NMOS active region and extending therebetween;

a second PMOS pass transistor comprising a fourth gate electrode disposed on the second PMOS active region;
a second NMOS pass transistor comprising a fifth gate electrode disposed on the second NMOS active region; and
a second pull-up transistor and a second pull-down transistor sharing a sixth gate electrode disposed on the second PMOS active region and the second NMOS active region and extending therebetween.

15. The SRAM cell of claim 14:
wherein the first PMOS pass transistor is coupled to a first bit and the second PMOS transistor is coupled to a first inverted bit line such that the first and second PMOS pass transistors provide a first port of the SRAM cell;
wherein the first NMOS pass transistor is coupled to a second bit line and the second NMOS transistor is coupled to a second inverted bit line such that the first and second NMOS pass transistors provide a second port of the SRAM cell; and
wherein the first and second PMOS pass transistors are coupled to a first word line and wherein the first and second NMOS transistors are coupled to a second word line.

16. The SRAM cell of claim 14:
wherein the first and second PMOS active regions and the first and second NMOS active regions each have wide and narrow portions;
wherein the first gate electrode is disposed on the wide portion of the first PMOS active region;
wherein the second gate electrode is disposed on the narrow portion of the first NMOS active region;
wherein the third gate electrode is disposed on the narrow portion of the first PMOS active region and the wide portion of the first NMOS active region;
wherein the fourth gate electrode is disposed on the wide portion of the second PMOS active region;
wherein the fifth gate electrode is disposed on the narrow portion of the second NMOS active region; and
wherein the sixth gate electrode is disposed on the narrow portion of the second PMOS active region and the wide portion of the second NMOS active region.

17. The SRAM cell of claim 16, wherein the first and second PMOS pass transistors and the first and second NMOS pull-down transistors have a greater channel width than the first and second NMOS pass transistors and the first and second PMOS pull-up transistors.

18. The SRAM cell of claim 16, wherein the first and second PMOS active regions and the first and second NMOS active regions are point symmetric with respect to a point located between the first and second NMOS active regions.

19. The SRAM cell of claim 16, wherein the first, second, third, fourth, fifth and sixth gate electrodes are point symmetric with respect to the point located between the first and second NMOS active regions;
wherein the first, second and sixth gate electrodes are aligned along a first line; and
wherein the third, fourth and fifth gate electrodes are aligned a long a second line parallel to the first line.

20. The SRAM cell of claim 15, further comprising a wiring structure configured to connect the first PMOS active region to a power supply node and to a first bit line, to connect the second PMOS active region to the power supply node and to a first inverted bit line, to connect the first NMOS active region to a ground node and to a second bit line, to connect the second NMOS active region to the ground node and to a second inverted bit line, to connect the third gate electrode to the second PMOS active region and the second NMOS active region and to connect the sixth gate electrode to the first PMOS active region and the first NMOS active region.

* * * * *